US010541653B2

(12) United States Patent
Zhu et al.

(10) Patent No.: US 10,541,653 B2
(45) Date of Patent: Jan. 21, 2020

(54) BROADBAND POWER TRANSISTOR DEVICES AND AMPLIFIERS WITH INPUT-SIDE HARMONIC TERMINATION CIRCUITS AND METHODS OF MANUFACTURE

(71) Applicant: NXP USA, Inc., Austin, TX (US)

(72) Inventors: Ning Zhu, Chandler, AZ (US); Jeffrey Spencer Roberts, Tempe, AZ (US); Damon G. Holmes, Scottsdale, AZ (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/984,137

(22) Filed: May 18, 2018

(65) Prior Publication Data
US 2019/0356274 A1 Nov. 21, 2019

(51) Int. Cl.
*H03F 3/191* (2006.01)
*H03F 3/16* (2006.01)
(Continued)

(52) U.S. Cl.
CPC ........... *H03F 1/0288* (2013.01); *H01L 23/66* (2013.01); *H01L 24/48* (2013.01); *H01L 24/85* (2013.01);
(Continued)

(58) Field of Classification Search
CPC .......... H03F 1/0288; H03F 3/191; H03F 1/56; H03F 1/565; H03F 1/086; H03F 3/195;
(Continued)

(56) References Cited

U.S. PATENT DOCUMENTS 6,236,274 B1  5/2001  Liu
6,734,728 B1 * 5/2004  Leighton .................. H01L 23/66
                                              257/401
(Continued)

FOREIGN PATENT DOCUMENTS

EP      0600548 A1    6/1994
EP      3160042 A1    4/2017
WO   2009060264 A1    5/2009

OTHER PUBLICATIONS

U.S. Appl. No. 15/827,679, filed Dec. 5, 2017 (pp. 1-32).
(Continued)

*Primary Examiner* — Khanh V Nguyen
(74) *Attorney, Agent, or Firm* — Sherry W. Schumm

(57) ABSTRACT

Embodiments of RF amplifiers and packaged RF amplifier devices each include a transistor with a drain-source capacitance that is relatively low, an input impedance matching circuit, and an input-side harmonic termination circuit. The input impedance matching circuit includes a harmonic termination circuit, which in turn includes a first inductance (a first plurality of bondwires) and a first capacitance coupled in series between the transistor output and a ground reference node. The input impedance matching circuit also includes a second inductance (a second plurality of bondwires), a third inductance (a third plurality of bondwires), and a second capacitance coupled in a T-match configuration between the input lead and the transistor input. The first and second capacitances may be metal-insulator-metal capacitors in an integrated passive device.

25 Claims, 10 Drawing Sheets

(51) Int. Cl.
  *H03F 1/02* (2006.01)
  *H03F 1/08* (2006.01)
  *H01L 23/66* (2006.01)
  *H01L 25/16* (2006.01)
  *H01L 23/00* (2006.01)
  *H01L 25/00* (2006.01)
  *H03F 3/21* (2006.01)
  *H03F 3/213* (2006.01)
  *H03F 3/195* (2006.01)

(52) U.S. Cl.
  CPC .............. *H01L 25/16* (2013.01); *H01L 25/50* (2013.01); *H03F 1/086* (2013.01); *H03F 3/195* (2013.01); *H03F 3/211* (2013.01); *H03F 3/213* (2013.01); *H01L 2223/6611* (2013.01); *H01L 2223/6655* (2013.01); *H01L 2223/6672* (2013.01); *H01L 2224/48091* (2013.01); *H01L 2224/48195* (2013.01); *H01L 2224/48227* (2013.01); *H01L 2924/1033* (2013.01); *H01L 2924/13064* (2013.01); *H01L 2924/13091* (2013.01); *H01L 2924/19011* (2013.01); *H01L 2924/19041* (2013.01); *H01L 2924/19042* (2013.01); *H01L 2924/19043* (2013.01); *H01L 2924/19107* (2013.01); *H03F 2200/222* (2013.01); *H03F 2200/267* (2013.01); *H03F 2200/387* (2013.01); *H03F 2200/451* (2013.01); *H03F 2200/552* (2013.01)

(58) Field of Classification Search
  CPC .... H03F 3/213; H03F 3/211; H03F 2200/387; H03F 2200/552; H03F 2200/267; H03F 2200/222; H03F 2200/451; H01L 23/66; H01L 24/85; H01L 25/50; H01L 24/48; H01L 25/16; H01L 2924/19043; H01L 2924/13091; H01L 2224/48227; H01L 2924/19107; H01L 2224/48195; H01L 2224/48091; H01L 2924/19011; H01L 2223/6611; H01L 2223/6672; H01L 2924/19041; H01L 2924/19042; H01L 2223/6655; H01L 2924/1033; H01L 2924/13064
  See application file for complete search history.

(56) References Cited

U.S. PATENT DOCUMENTS

| | | | | |
|---|---|---|---|---|
| 7,276,420 B2* | 10/2007 | Liu | ..................... | H01L 23/642 |
| | | | | 257/E21.003 |
| 7,564,303 B2* | 7/2009 | Perugupalli | ............. | H01L 23/66 |
| | | | | 330/307 |
| 7,728,671 B2* | 6/2010 | Blair | ....................... | H01L 23/66 |
| | | | | 330/290 |
| 8,659,359 B2* | 2/2014 | Ladhani | ................. | H03F 1/0288 |
| | | | | 330/302 |
| 8,736,379 B1* | 5/2014 | Wilson | .................... | H03F 1/565 |
| | | | | 330/277 |
| 8,823,455 B2 | 9/2014 | Kobayashi | | |
| 8,970,308 B2* | 3/2015 | Wilson | ..................... | H03H 7/38 |
| | | | | 330/253 |
| 9,281,283 B2* | 3/2016 | Viswanathan | .... | H01L 23/49589 |
| 9,438,184 B2* | 9/2016 | Jones | ..................... | H01L 23/488 |
| 9,503,025 B2 | 11/2016 | Cao et al. | | |
| 9,571,044 B1* | 2/2017 | Zhu | ......................... | H03F 1/565 |
| 9,673,766 B1 | 6/2017 | Roberts et al. | | |
| 9,692,363 B2* | 6/2017 | Zhu | ......................... | H03F 1/565 |
| 9,762,185 B2* | 9/2017 | Ladhani | ................. | H03F 1/0288 |
| 9,979,361 B1 | 5/2018 | Mangaonkar et al. | | |
| 2003/0076173 A1* | 4/2003 | Moller | ..................... | H01L 23/48 |
| | | | | 330/295 |
| 2005/0083723 A1 | 4/2005 | Blednov et al. | | |
| 2008/0315392 A1 | 12/2008 | Farrell et al. | | |
| 2013/0033325 A1 | 2/2013 | Ladhani et al. | | |
| 2016/0344353 A1 | 11/2016 | Watts et al. | | |
| 2017/0117856 A1 | 4/2017 | Zhu et al. | | |
| 2018/0061785 A1 | 3/2018 | Peyrot et al. | | |

OTHER PUBLICATIONS

U.S. Appl. No. 15/832,381, filed Dec. 5, 2017 (pp. 1-49).
Mohadeskasaei, et al., "A 30 Watt High Efficient High Power RF Pulse Power Amplifier," 2016 IEEE MTT-S International Conference on Numerical Electromagnetic and Multiphysics Modeling and Optimization (NEMO), Beijing, Jul. 2016 (pp. 1-3).
D. Wu, et al., "Design of a broadband and highly efficient 45W GaN power amplifier via simplified real frequency technique," 2010 IEEE MTT-S International Microwave Symposium, Anaheim, CA, May 2010 (pp. 1090-1093).
H. Taghavi, et al., "Broadband high efficiency GaN RF power amplifier for multi-band applications," Proceedings of 2014 Mediterranean Microwave Symposium (MMS2014), Marrakech, Dec. 2014 (pp. 1-4).
K. Krishnamurthy, "Ultra-Broadband, Efficient, Microwave Power Amplifiers in Gallium Nitride HEMT Technology," PhD Dissertation, University of California, Santa Barbara, May 2000 (pp. 1-195).
Non Final Office Action; U.S. Appl. No. 15/938,974; 10 pages (Jun. 13, 2019).
U.S. Appl. No. 15/983,974; 50 pages; filed May 18, 2018.

* cited by examiner

US 10,541,653 B2

BROADBAND POWER TRANSISTOR DEVICES AND AMPLIFIERS WITH INPUT-SIDE HARMONIC TERMINATION CIRCUITS AND METHODS OF MANUFACTURE

TECHNICAL FIELD

Embodiments of the subject matter described herein relate generally to radio frequency (RF) amplifiers, and more particularly to broadband power transistor devices and amplifiers, and methods of manufacturing such devices and amplifiers.

BACKGROUND

Wireless communication systems employ power amplifiers for increasing the power of radio frequency (RF) signals. In a cellular base station, for example, a Doherty power amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

In the field of power amplifier device design, it is becoming increasingly desirable to achieve concurrent multi-band, broadband amplification. To successfully design a wideband power amplifier device for concurrent multi-band, broadband operation in a Doherty power amplifier circuit, for example, it is desirable to enable a good broadband fundamental match (e.g., over 20 percent fractional bandwidth) to appropriately handle harmonic frequency interactions, and to enable a wide video bandwidth. However, achieving these goals continues to provide challenges to power amplifier device designers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
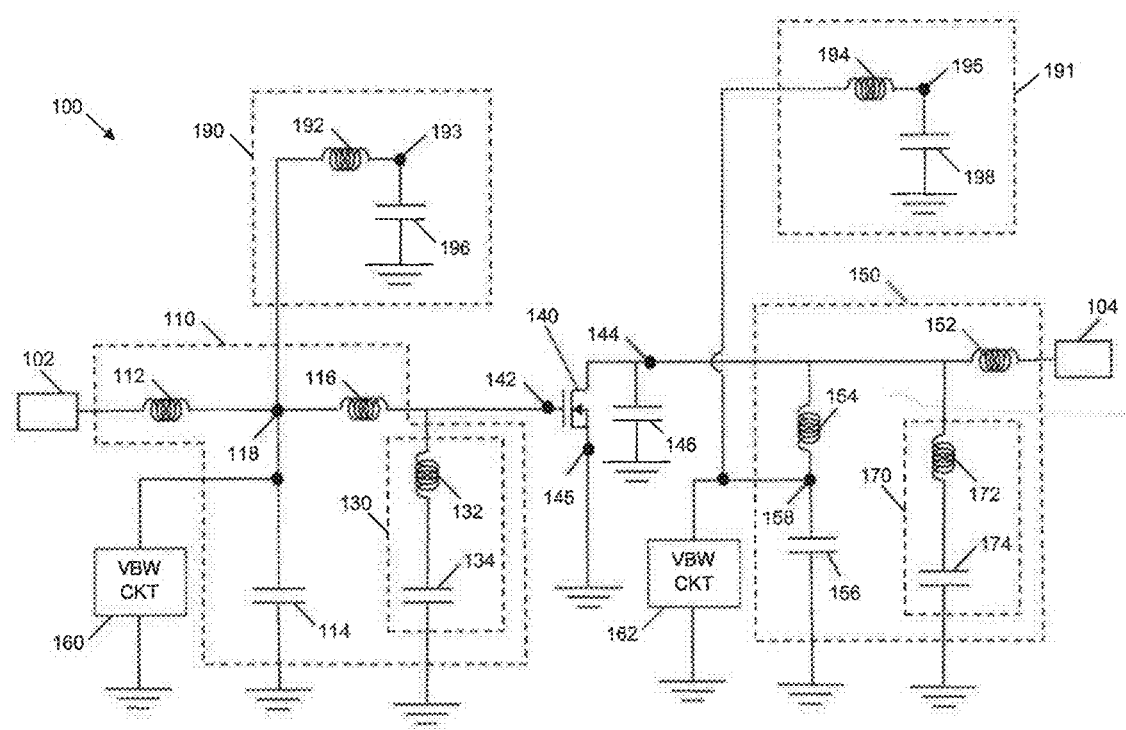
FIG. 1 is a schematic circuit diagram of a power amplifier circuit, in accordance with an example embodiment.

In the field of high-power radio frequency (RF) power amplification for cellular base stations and other applications, broadband power amplification using silicon-based devices (e.g., laterally diffused metal oxide semiconductor (LDMOS) power transistor devices with output matching networks) has been successfully achieved. However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification (e.g., over 20 percent fractional bandwidth).

For example, the nonlinear input capacitance of RF power devices that include GaN transistors are known to generate harmonics and intermodulation distortion that can impair efficiency and linearity. In addition, when compared with a silicon-based LDMOS transistor, the drain-source capacitance, Cds, of a GaN-based transistor is relatively low on a per RF output peak power basis. For example, whereas an LDMOS transistor may have a drain-source capacitance greater than about 0.4 picofarads per watt (pF/W), a GaN-based transistor may have a drain-source capacitance less than about 0.2 pF/W. If a GaN-based transistor were used in a conventional device, a relatively high inductance between the transistor output and a shunt capacitor within an output impedance matching circuit (referred to herein as "D2" inductance) would be needed to provide adequate output impedance matching. In a conventional device, this relatively high D2 inductance could be achieved, for example, using a series combination of a set of bondwires between the transistor die that includes the transistor and an additional series inductance, such as an integrated spiral inductor (e.g., a printed coil). For example, such an integrated spiral inductor could be implemented using a copper-based, integrated spiral inductor in the transistor die or in an output circuit. Unfortunately, such an integrated inductor may have a relatively low Q, which may lead to a significant efficiency drop (e.g., a drop on the order of about 3 percent at 2 gigahertz (GHz)) for the device.

Second harmonic terminations also play an important role in the overall performance of a power amplifier design that uses GaN-based transistors. Without the information of second harmonics impedance at the current source plane, it is very difficult to tune a power amplifier to achieve relatively high fractional bandwidth with good performance. Furthermore, the second harmonic termination may vary significantly across a large bandwidth for broadband applications, which further increases the difficulty of circuit tuning.

To overcome these and other challenges in designing broadband power amplifiers using GaN-based devices, embodiments disclosed herein may achieve broadband input impedance matching at fundamental frequency using simple input T-match. An input-side harmonic termination circuit is added close to the gate using a bondwire connection and an RF capacitor. A shunt capacitor in the input-side impedance matching circuit is desirably selected to be eligible for broadband impedance matching. Some specific embodiments of the inventive subject matter include input harmonic termination circuitry that includes an integrated capacitance (e.g., metal-insulator-metal (MIM) capacitor) and an inductance (e.g., in the form of a bondwire array) series-coupled between the transistor input and a ground reference.

In addition, the shunt capacitor in the input-side impedance matching circuit also has a high enough capacitance value (e.g., greater than 60 picofarads) to provide an acceptable RF low-impedance point (e.g., a quasi-RF cold-point). This RF low-impedance point represents a low impedance point in the circuit for RF signals. A baseband termination circuit with good RF isolation is connected to the quasi-RF cold-point.

In addition, in some embodiments, the D2 inductance provided between the transistor output and the shunt capacitor within the output impedance matching circuit is significantly reduced with the inclusion of a harmonic termination circuit at the output of the device. Along with facilitating a reduction in the D2 inductance, the harmonic termination circuitry embodiments may be used to control the second harmonic impedance across a wide (e.g., 20 percent plus) fractional bandwidth at relatively low impedance (e.g., close to short circuit). This may be useful in achieving relatively high efficiency for broadband applications. Some specific embodiments of the inventive subject matter include output harmonic termination circuitry that includes an integrated capacitance (e.g., MIM capacitor) and an inductance (e.g., in the form of a bondwire array) series-coupled between the transistor output and a ground reference.

During operation of an embodiment of a device, the output-side harmonic termination circuit is essentially equivalent to a capacitor at a fundamental frequency of operation of the device, with the capacitance value being approximately equivalent to the effective capacitance of a series-coupled inductance and capacitance (e.g., inductor 172 and capacitor 174, FIG. 1) of the harmonic termination circuit. Because this equivalent shunt capacitance from the combination of the series-coupled inductance and capacitance is coupled in parallel with the drain-source capacitance between the transistor output and the ground reference, the equivalent shunt capacitance in the harmonic termination circuit effectively increases the drain-source capacitance of the transistor. In some embodiments, the equivalent shunt capacitance from the series-coupled combination of the inductance and capacitance in the harmonic termination circuit has a capacitance value that effectively increases the drain-source capacitance of the transistor to which it is connected by at least 10 percent (e.g., between 10 percent and about 50 percent or more).

As a result of this effective increase in the drain-source capacitance, the D2 inductance between the transistor output and the shunt capacitor within the output impedance matching circuit may be decreased, when compared with conventional circuits. Accordingly, whereas a conventional circuit may require an additional inductor to provide a D2 inductance that is greater than the inductance provided by the bondwires connected between the transistor die and the shunt capacitor within the output impedance matching circuit, as discussed above, no such additional inductance is included in output impedance matching circuits within device embodiments discussed herein. Instead, in device embodiments discussed herein, bondwires of the output impedance matching circuit may be directly connected (as defined later) to the shunt capacitance of the output impedance matching circuit.

In addition, the harmonic termination circuitry embodiments may be used to control the second harmonic impedance across a wide (e.g., 20 percent plus) fractional bandwidth at relatively low impedance (e.g., close to short circuit). This may be useful in achieving relatively high efficiency for broadband applications.

FIG. 1 is a schematic diagram of an RF power amplifier circuit 100. Circuit 100 includes an input 102 (e.g., a first conductive package lead), an input impedance matching circuit 110 (which includes a harmonic termination circuit 130), a transistor 140, an output impedance matching circuit 150 (which includes a harmonic termination circuit 170), video bandwidth circuits 160, 162, and an output lead 104 (e.g., a second conductive package lead), in an embodiment. Each of the input and output 102, 104 may be more generally referred to as an "RF input/output (I/O)."

The input impedance matching circuit 110 (including harmonic termination circuit 130) and video bandwidth circuit 160 may be referred to collectively as an "input circuit." Similarly, the output impedance matching circuit 150 (including harmonic termination circuit 170) and video bandwidth circuit 162 may be referred to collectively as an "output circuit." Although transistor 140 and various elements of the input and output impedance matching circuits 110, 150, the video bandwidth circuits 160, 162, and the harmonic termination circuits 130, 170 are shown as singular components, the depiction is for the purpose of ease of explanation only. Those of skill in the art would understand, based on the description herein, that transistor 140 and/or certain elements of the input impedance matching circuit 110 (including the harmonic termination circuit 130), the output impedance matching circuit 150 (including the harmonic termination circuit 170), and the video bandwidth circuits 160, 162 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 140 and various elements of the input impedance matching circuit 110 (including the harmonic termination circuit 130), the output impedance matching circuit 150 (including the harmonic termination circuit 170), and the video bandwidth circuits 160, 162, below, thus are not intended to limit the scope of the inventive subject matter only to the illustrated embodiments.

Input 102 and output 104 each may include a conductor, which is configured to enable the circuit 100 to be electrically coupled with external circuitry (not shown). More specifically, the input and output 102, 104 are physically positioned to span between the exterior and the interior of the device's package. Input impedance matching circuit 110 (including harmonic termination circuit 130) and video bandwidth circuit 160 are electrically coupled between the input 102 and a first terminal 142 of transistor 140 (e.g., the gate), which is also located within the device's interior. Similarly, output impedance matching circuit 150 (including harmonic termination circuit 170) and video bandwidth circuit 162 are electrically coupled between a second terminal 144 of transistor 140 (e.g., the drain) and the output 104.

According to an embodiment, transistor 140 is the primary active component of circuit 100. Transistor 140 includes a control terminal 142 and two current conducting terminals 144, 145, where the current conducting terminals 144, 145 are spatially and electrically separated by a variable-conductivity channel. For example, transistor 140 may be a field effect transistor (FET), which includes a gate (control terminal 142), a drain (a first current conducting terminal 144), and a source (a second current conducting terminal 145). According to an embodiment, and using nomenclature typically applied to FETs in a non-limiting manner, the gate 142 of transistor 140 is coupled to the input impedance matching circuit 110 (including the harmonic termination circuit 130) and the video bandwidth circuit 160, the drain 144 of transistor 140 is coupled to the output impedance matching circuit 150 (including the harmonic termination circuit 170) and the video bandwidth circuit 162, and the source 145 of transistor 140 is coupled to ground (or another voltage reference). Through the variation of control signals provided to the gate of transistor 140, the current between the current conducting terminals of transistor 140 may be modulated.

According to various embodiments, transistor 140 is a III-V field effect transistor (e.g., a high electron mobility transistor (HEMT)), which has a relatively low drain-source capacitance, Cds, when compared with a silicon-based FET (e.g., an LDMOS FET). In FIG. 1, the drain-source capacitance of transistor 140 is represented with capacitor 146 between the drain of transistor 140 and a transistor output terminal 144 (e.g., corresponding to transistor output terminal 744, FIG. 7). More specifically, capacitor 146 is not a physical component, but instead models the drain-source capacitance of transistor 140. According to an embodiment, transistor 140 may have a drain-source capacitance that is less than about 0.2 pF/W. Further, in some embodiments, transistor 140 may be a GaN FET, although in other embodiments, transistor 140 may be another type of III-V transistor (e.g., gallium arsenide (GaAs), gallium phosphide (GaP), indium phosphide (InP), or indium antimonide (InSb)), or another type of transistor that has a relatively low drain-source capacitance.

Input impedance matching circuit 110 is coupled between the input 102 and the control terminal 142 (e.g., gate) of the transistor 140. Input impedance matching circuit 110 is configured to raise the impedance of circuit 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 has a T-match configuration, which includes two inductive elements 112, 116 (e.g., two sets of bondwires) and a shunt capacitance 114. A first inductive element 112 (e.g., a first set of bondwires) is coupled between input 102 and a node 118, which in turn is coupled to a first terminal of capacitor 114, and a second inductive element 116 (e.g., a second set of bondwires) is coupled between the node 118 (or the first terminal of capacitor 114) and the control terminal 142 of transistor 140. The second terminal of capacitor 114 is coupled to ground (or another voltage reference). The combination of inductive elements 112, 116 and shunt capacitance 114 functions as a low-pass filter. According to an embodiment, the series combination of inductive elements 112, 116 may have an inductance value in a range between about 50 picohenries (pH) to about 3 nanohenries (nH), and shunt capacitance 114 may have a capacitance value in a range between about 5 picofarads (pF) to about 120 pF. In some embodiments, shunt capacitance 114 may have a relatively-large capacitance (e.g., greater than about 60 pF) to provide an acceptable RF low-impedance point.

In addition, harmonic termination circuit 130 is coupled between the control terminal 142 (e.g., gate) of transistor 140 and ground (or another voltage reference). Harmonic termination circuit 130 includes inductive element 132 (e.g., a third set of bondwires) and capacitance 134 coupled in series between the control terminal 142 of transistor 140 and ground (or another voltage reference), and this series combination of elements functions as a low impedance path to ground for signal energy at a harmonic frequency (e.g., a second harmonic of a fundamental frequency of operation of circuit 100). According to an embodiment, inductive element 132 may have an inductance value in a range between about 20 pH to about 1 nH, and capacitance 134 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 132 may have an inductance value of about 120 pH, and capacitance 134 may have a capacitance value of about 12 pF. As will be explained later, the desired inductance and/or capacitance values used to achieve a low impedance path to ground for signal energy at the second harmonic frequency may be affected by mutual coupling between bondwires used to implement inductors 116 and 132.

According to an embodiment, an RF low-impedance point may present at or coupled to the node 118 between inductive elements 112 and 116, where the RF low-impedance point represents a low impedance point in the circuit for RF signals. According to an embodiment, a video bandwidth (VBW) circuit 160 is coupled between node 118 (e.g., or an RF low-impedance point at or coupled to node 118) and the ground reference node. Video bandwidth circuit 160 may function to improve the low frequency resonance (LFR) of circuit 100 caused by the interaction between the input matching circuit 110 and the bias feeds (not shown) by presenting a low impedance at envelope frequencies and/or a high impedance at RF frequencies. Video bandwidth circuit 160 essentially may be considered to be "invisible" from an RF matching standpoint, as it primarily effects the impedance at envelope frequencies (i.e., video bandwidth circuit 160 provides terminations for the envelope frequencies of circuit 100). As will be discussed in more detail later in conjunction with FIGS. 2A-2F, the video bandwidth circuit 160 may have any of a number of different circuit configurations, in various embodiments.

On the output side of the circuit 100, output impedance matching circuit 150 is coupled between the first current conducting terminal 144 (e.g., drain) of transistor 140 and the output 104. Output impedance matching circuit 150 is configured to match the output impedance of circuit 100 with the input impedance of an external circuit or component (not shown) that may be coupled to output 104. According to an embodiment, output impedance matching circuit 150 includes two inductive elements 152, 154 and shunt capacitance 156. A first inductive element 152 (e.g., a fourth set of bondwires) is coupled between the first current conducting terminal 144 (e.g., drain) of transistor 140 and the output 104. A second inductive element 154 (e.g., a fifth set of bondwires corresponding to the D2 inductance) is coupled between the first current conducting terminal 144 of transistor 140 and a node 158, which corresponds to an RF low-impedance point node, in an embodiment. A second terminal of the shunt capacitance 156 is coupled to ground (or to another voltage reference), in an embodiment.

The shunt inductive element 154 and the shunt capacitance 156 are coupled in series between a current conducting terminal 144 of transistor 140 and ground, and this combination of impedance matching elements functions as a first (high-pass) matching stage. Accordingly, the combination of shunt inductive element 154 and shunt capacitance 156 may be referred to herein as a high-pass matching circuit 143. According to an embodiment, shunt inductive element 154 may have an inductance value in a range between about 100 pH to about 3 nH, and shunt capacitance 156 may have a capacitance value in a range between about 30 pF to about 500 pF, although these components may have values outside of these ranges, as well.

Although not shown in FIG. 1, the output impedance matching circuit 150 also may include a second shunt circuit, which includes an additional shunt inductor (e.g., additional bondwires having an inductance value in a range between about 50 pH to about 1 nH) and an additional shunt capacitor (e.g., having a capacitance value in a range between about 1 pF to about 50 pF) coupled in series between the drain of transistor 140 and ground. This additional combination of impedance matching elements may function as a second (low-pass) matching stage.

In addition, harmonic termination circuit 170 is coupled between the first current conducting terminal 144 (e.g., drain) of transistor 140 and ground (or another voltage reference). Harmonic termination circuit 170 includes inductive element 172 (e.g., a sixth set of bondwires) and capacitance 174 coupled in series between the first current conducting terminal 144 of transistor 140 and ground (or another voltage reference), and this series combination of elements functions as another low impedance path to ground for signal energy at a harmonic frequency (e.g., a second harmonic of a fundamental frequency of operation of circuit 100). According to an embodiment, inductive element 172 may have an inductance value in a range between about 20 pH to about 1 nH, and capacitance 174 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 172 may have an inductance value of about 140 pH, and capacitance 174 may have a capacitance value of about 11 pF. As will be explained later, the desired inductance and/or capacitance values used to achieve a low impedance path to ground for signal energy at the second harmonic frequency may be affected by mutual coupling between bondwires used to implement inductors 152, 154, and 172.

Referring again to the first (high-pass) matching stage, an RF low-impedance point 158 is present at the node between the shunt inductive element 154 and the shunt capacitance 156. Again, the RF low-impedance point 158 represents a low impedance point in the circuit for RF signals. According to an embodiment, another video bandwidth circuit 162 is coupled between the RF low-impedance point 158 and the ground reference node. Again, video bandwidth circuit 162 may function to further improve the LFR of circuit 100 caused by the interaction between the output impedance matching circuit 150 and the bias feeds (not shown) by presenting a low impedance at envelope frequencies and/or a high impedance at RF frequencies. Video bandwidth circuit 162 also may be considered to be "invisible" from an RF matching standpoint. As will now be described in conjunction with FIGS. 2A-2F, the video bandwidth circuit 162 (and circuit 160) may have any of a number of different circuit configurations, in various embodiments.

For example, FIGS. 2A-2F illustrate six example embodiments of video bandwidth circuits (e.g., video bandwidth circuits 160, 162, FIG. 1). In each of FIGS. 2A-2F, video bandwidth circuit 200, 201, 202, 203, 204, 205 is coupled between a connection node 218 (e.g., node 118 and/or node 158, FIG. 1) and ground (or another voltage reference). Further, each video bandwidth circuit 200-205 includes an envelope inductance 262, $L_{env}$, an envelope resistor 264, $R_{env}$, and an envelope capacitor 266, $C_{env}$, coupled in series between the connection node 218 and ground. In each of FIGS. 2A-2E, a first terminal of envelope inductance 262 is coupled to node 218, and a second terminal of envelope inductance 262 is coupled to node 280. A first terminal of envelope resistor 264 is coupled to node 280, and a second terminal of envelope resistor 264 is coupled to node 282. A first terminal of envelope capacitor 266 is coupled to node 282, and a second terminal of the envelope capacitor 266 is coupled to ground (or another voltage reference). Although the order of the series of components between node 218 and the ground reference node is the envelope inductance 262, the envelope resistor 264, and the envelope capacitor 266 in FIGS. 2A-2E, the order of components in the series circuit could be different, in other embodiments. For example, in FIG. 2F, the envelope resistor 264 is coupled between node 218 and a node 284, the envelope inductance 262 is coupled between node 284 and a node 286, and the envelope capacitor 266 is coupled between node 286 and ground (or another voltage reference).

Referring to FIGS. 2A-2F, and according to an embodiment, the envelope inductance 262, may be implemented as an integrated inductance (e.g., inductance 562, 762, FIGS. 5-9), as a discrete inductor, and/or as a set of bondwires coupling the connection node 218 to the envelope resistor 264 (e.g., via node 280). For example, and as will be described in detail later, envelope inductance 262 may be integrally formed as a portion of an integrated passive device (IPD), such as IPD 480-483, FIGS. 4-9. For example, envelope inductance 262 may have an inductance value in a range between about 5 pH to about 2000 pH. Desirably, envelope inductance 262 has an inductance value less than about 500 pH (e.g., as low as 50 pH, in an embodiment, or possibly even lower). In other embodiments, the value of envelope inductance 262 may be lower or higher than the above-given range.

Envelope resistor 264 may be implemented as an integrated resistor (e.g., resistor 564, 764, FIGS. 5-9), in an embodiment, or as a discrete resistor, in another embodiment. For example, envelope resistor 264 may be integrally formed as a portion of an IPD, such as IPD 480-483, FIGS. 4-9. In an embodiment, envelope resistor 264 may have a resistance value in a range between about 0.1 ohm to about 5.0 ohm, although envelope resistor 264 may have a resistance value outside of this range, as well.

Envelope capacitor 266 may be implemented as an integrated capacitor (e.g., capacitor 566, 766, FIGS. 5-9), in an embodiment, or as a discrete capacitor (e.g., a "chip capacitor"), in another embodiment. For example, envelope capacitor 266 may be integrally formed as a portion of an IPD, such as IPD 480-483, FIGS. 4-9. In an embodiment, envelope capacitor 266 may have a capacitance value in a range between about 1 nanofarad (nF) to about 1 microfarad (μF), although envelope capacitor 266 may have a capacitance value outside of this range, as well.

Figure 2A:
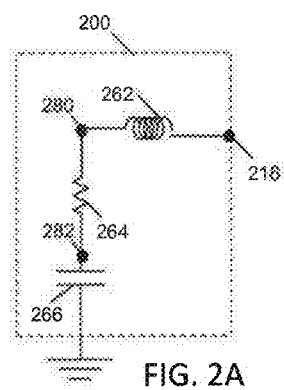
FIGS. 2A-2F illustrate various example embodiments of video bandwidth circuits.

The first embodiment of video bandwidth circuit 200 illustrated in FIG. 2A includes a simple series combination of envelope inductance 262, envelope resistor 264, and envelope capacitor 266. Conversely, in the embodiments of FIGS. 2B-2F, the video bandwidth circuit 201-205 may include one or more "bypass" or "parallel" capacitors 268, 270, 272, 274, 276, 278, $C_{para}$, which are coupled in parallel with the envelope inductance 262 and/or the envelope resistor 264. Each of the bypass capacitors 268, 270, 272, 274, 276, 278 may be implemented as a discrete capacitor (e.g., capacitor 578, 778, FIGS. 5-9), in some embodiments, or as an integrated capacitor, in other embodiments. In each of these embodiments, a bypass capacitor 268, 270, 272, 274, 276, 278 may have a capacitance value in a range between about 3.0 pF to about 1400 pF. In other embodiments, the value of any of bypass capacitors 268, 270, 272, 274, 276, 278 may be lower or higher than the above-given range.

Figure 2B:
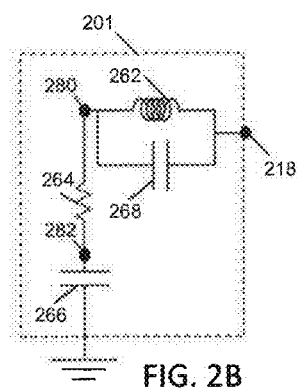

In the video bandwidth circuit 201 of FIG. 2B, bypass capacitor 268, $C_{para}$, is coupled in parallel with the envelope inductance 262. More specifically, first terminals of envelope inductance 262 and bypass capacitor 268 are coupled to node 218, and second terminals of envelope inductance 262 and bypass capacitor 268 are coupled to node 280.

Figure 2C:
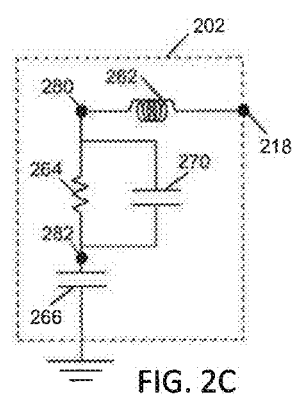

In the video bandwidth circuit 202 of FIG. 2C, bypass capacitor 270, $C_{para}$, is coupled in parallel with the envelope resistor 364. More specifically, first terminals of envelope resistor 264 and bypass capacitor 270 are coupled to node 280, and second terminals of envelope resistor 264 and bypass capacitor 270 are coupled to node 282.

Figure 2D:
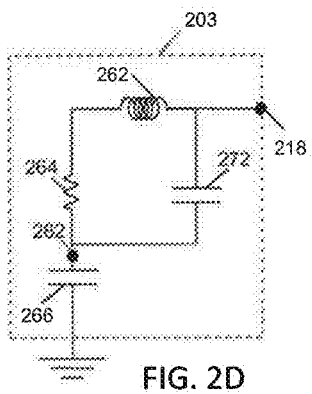

In the video bandwidth circuit 203 of FIG. 2D, bypass capacitor 272, $C_{para}$, is coupled in parallel with the envelope inductance 262 and envelope resistor 264. More specifically, bypass capacitor 272 is coupled across nodes 218 and 282.

Figure 2E:
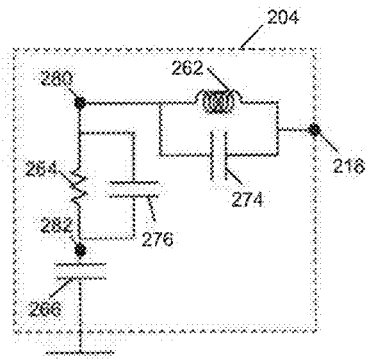

In the video bandwidth circuit 204 of FIG. 2E, a first bypass capacitor 274, $C_{para1}$, is coupled in parallel with the envelope inductance 262, and a second bypass capacitor 276, $C_{para2}$, is coupled in parallel with the envelope resistor 264. More specifically, first terminals of envelope inductance 262 and first bypass capacitor 274 are coupled to node 218, and second terminals of envelope inductance 5262 and first bypass capacitor 274 are coupled to node 280. In addition, first terminals of envelope resistor 264 and second bypass capacitor 276 coupled to node 280, and second terminals of envelope resistor 264 and second bypass capacitor 276 are coupled to node 282.

Figure 2F:
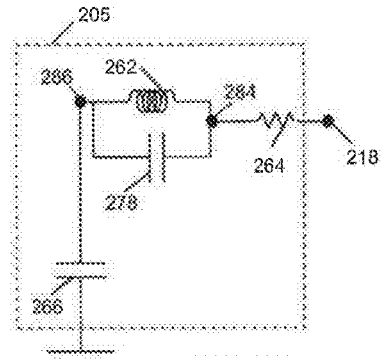

Referring to the video bandwidth circuits 201, 204, and 205 of FIGS. 2B, 2E, and 2F, parallel-coupled inductance 262 and capacitor 268, 274 or 278 form a parallel resonant circuit at frequencies in proximity to the center operational frequency of the device or circuit (e.g., circuit 100) within which circuit 201, 204 or 205 is incorporated. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because $L_{env}/C_{para}$ form a parallel resonant circuit at frequencies in proximity to the center operational frequency of the device, the parallel resonant circuit $L_{env}/C_{para}$ essentially appears as an open circuit to such frequencies. Accordingly, RF energy near the center operational frequency that may be present at the node 218 to which circuit 201, 204 or 205 is coupled will be deflected by the parallel resonant circuit $L_{env}/C_{para}$. This deflection may be provided even using a relatively low inductance value for inductance 262. For these reasons, circuits 201, 204, and 205 may significantly improve the LFR of a device or circuit (e.g., circuit 100) in which it is incorporated by presenting a low impedance at envelope frequencies and a high impedance at RF frequencies.

In each of the embodiments of video bandwidth circuits 202, 203, 204 of FIGS. 2C, 2D, and 2E, bypass capacitor 270, 272 or 276 is coupled in parallel with envelope resistor 264. Because capacitor 270, 272 or 276 may function to route RF current around the envelope resistor 264, circuits 202, 203, 204 may result in a reduction in the RF current dissipated by the envelope resistor 264. This characteristic of circuits 202, 203, 204 also may serve to better protect the envelope resistor 264 from potential compromise due to excessive current that may otherwise flow through the envelope resistor 264 in the absence of bypass capacitor 270, 272 or 276.

Each of circuits 201-205 may increase the device efficiency, when compared with circuit 200, since they allow less RF current to flow through (and be dissipated by) the envelope resistor 264. Further, because circuits 201-205 present a high impedance to RF frequencies in proximity to the center operational frequency of a device into which the video bandwidth circuit is incorporated, it is not as important for circuits 201-205 to be connected to an RF low-impedance point (e.g., RF low-impedance point 158, FIG. 1), although they may be. Instead, the benefits of circuits 201-205 may be achieved even when circuits 201-205 are coupled to a node that shows high RF impedance. This includes other nodes in both the input and output impedance matching circuits.

Referring again to FIG. 1, and as will be described in more detail later in conjunction with FIGS. 4-9, various embodiments of RF amplifier devices may include at least one input-side integrated passive device (IPD) assembly (e.g., IPD assemblies 480, 481, FIGS. 4-6), and at least one output-side IPD assembly (e.g., IPD assemblies 482, 483, FIGS. 4 and 7-9). The input-side IPD assembly(ies) (e.g., IPD assemblies 480, 481) include portions of the input circuit 110 (including the harmonic termination circuit 130) and the video bandwidth circuit 160. Similarly, the output-side IPD assembly(ies) (e.g., IPD assemblies 482, 483) include portions of the output circuit 150 (including the harmonic termination circuit 170) and the video bandwidth circuit 162. More specifically, each IPD assembly may include a semiconductor substrate with one or more integrated passive components. In a particular embodiment, each input-side IPD assembly may include shunt capacitances 114 and 132, and components of video bandwidth circuit 160 (e.g., components 262, 264, 266, 268, 270, 272, 274, 276, 278, FIGS. 2A-2F). In other particular embodiments, each output-side IPD assembly may include shunt capacitances 156 and 174, and components of video bandwidth circuit 162 (e.g., components 262, 264, 266, 268, 270, 272, 274, 276, 278, FIGS. 2A-2F).

In other embodiments, some portions of the input and output impedance matching circuits 110, 150 and video bandwidth circuits 160, 162 may be implemented as distinct/discrete components or as portions of other types of assemblies (e.g., a low-temperature co-fired ceramic (LTCC) device, a small PCB assembly, and so on). In still other embodiments, some portions of the input and/or output impedance matching circuits 110, 150 may be coupled to and/or integrated within the semiconductor die that includes transistor 140. The below, detailed description of embodiments that include IPD assemblies should not be taken to limit the inventive subject matter, and the term "passive device substrate" or "IPD substrate" means any type of structure that includes a passive device, including an IPD, a LTCC device, a transistor die, a PCB assembly, and so on.

In various embodiments, amplifier circuit 100 also may include bias circuitry 190, 191. The bias circuits 190, 191 each include an inductive element 192, 194, and a capacitor 196, 198, connected in series, with an intermediate node 193, 195 between each inductor/capacitor pair. To provide a bias voltage to the gate terminal 142 and/or to the drain terminal 144 of the transistor 140, an external bias circuit (not shown) may be connected to each of nodes 193, 195, and the bias voltage may be provided through this node. In other embodiments, either or both the input-side or output-side bias circuits 190, 191 may be excluded. In such embodiments, the external bias circuits may be connected instead to the input 102 or to the output 104, and the bias voltage(s) may be provided through the input 102 and/or the output 104.

The RF amplifier circuit 100 of FIG. 1 may be utilized as a single-path amplifier, which receives an RF signal at input 102, amplifies the signal through transistor 140, and produces an amplified RF signal at output 104. Alternatively, multiple instances of the RF amplifier circuit 100 may be utilized to provide a multiple-path amplifier, such as a Doherty power amplifier or another type of multi-path amplifier circuit.

Figure 3:
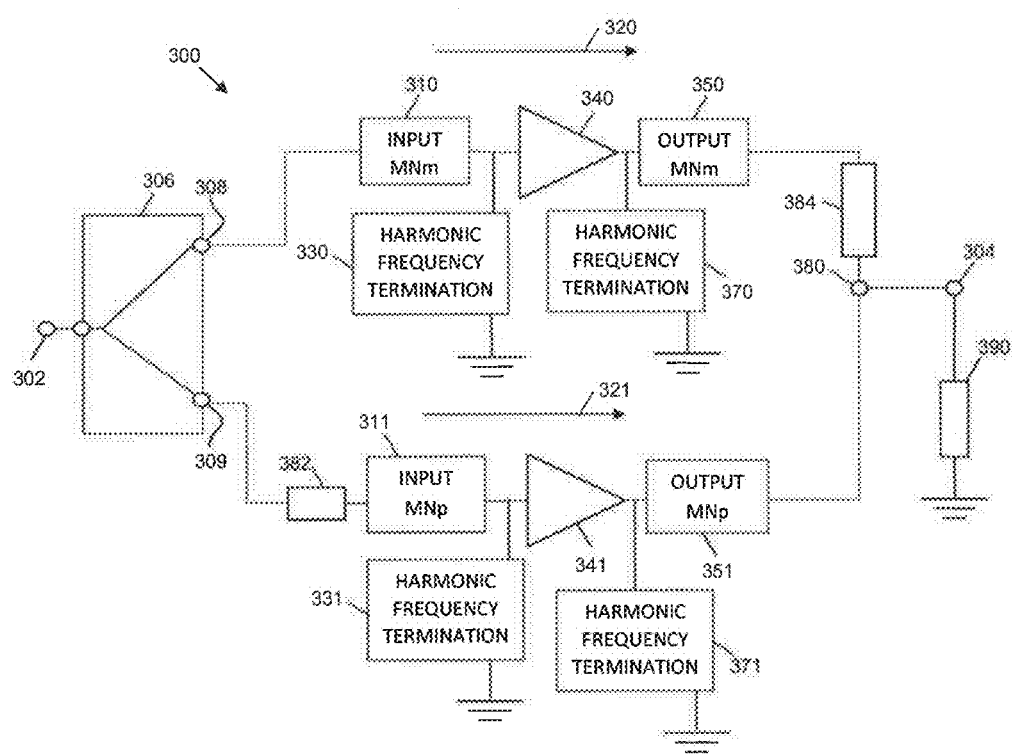
FIG. 3 is a simplified schematic diagram of a Doherty power amplifier, in accordance with an example embodiment.

For example, FIG. 3 is a simplified schematic diagram of a Doherty power amplifier 300 in which embodiments of RF power amplifier circuit 100 may be implemented. Amplifier 300 includes an input node 302, an output node 304, a power divider 306 (or splitter), a main amplifier path 320, a peaking amplifier path 321, and a combining node 380. A load 390 may be coupled to the combining node 380 (e.g., through an impedance transformer, not shown) to receive an amplified RF signal from amplifier 300.

Power divider 306 is configured to divide the power of an input RF signal received at input node 302 into main and peaking portions of the input signal. The main input signal is provided to the main amplifier path 320 at power divider output 308, and the peaking input signal is provided to the peaking amplifier path 321 at power divider output 309. During operation in a full-power mode when both the main and peaking amplifiers 340, 341 are supplying current to the load 390, the power divider 306 divides the input signal power between the amplifier paths 320, 321. For example, the power divider 306 may divide the power equally, such that roughly one half of the input signal power is provided to each path 320, 321 (e.g., for a symmetric Doherty amplifier configuration). Alternatively, the power divider 306 may divide the power unequally (e.g., for an asymmetric Doherty amplifier configuration).

Essentially, the power divider 306 divides an input RF signal supplied at the input node 302, and the divided signals are separately amplified along the main and peaking amplifier paths 320, 321. The amplified signals are then combined in phase at the combining node 380. It is important that phase coherency between the main and peaking amplifier paths 320, 321 is maintained across a frequency band of interest to ensure that the amplified main and peaking signals arrive in phase at the combining node 380, and thus to ensure proper Doherty amplifier operation.

Each of the main amplifier 340 and the peaking amplifier 341 includes one or more single-stage or multiple-stage power transistor integrated circuits (ICs) (or power transistor die) for amplifying an RF signal conducted through the amplifier 340, 341. According to various embodiments, all amplifier stages or a final amplifier stage of either or both the main amplifier 340 and/or the peaking amplifier 341 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 340 or the peaking amplifier 341 is implemented as a III-V FET, the other amplifier may be implemented as a silicon-based FET (e.g., an LDMOS FET), in some embodiments.

Although the main and peaking power transistor ICs may be of equal size (e.g., in a symmetric Doherty configuration), the main and peaking power transistor ICs may have unequal sizes (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 300, the main amplifier 340 is biased to operate in class AB mode, and the peaking amplifier 341 is biased to operate in class C mode. At low power levels, where the power of the input signal at node 302 is lower than the turn-on threshold level of peaking amplifier 341, the amplifier 300 operates in a low-power (or back-off) mode in which the main amplifier 340 is the only amplifier supplying current to the load 390. When the power of the input signal exceeds a threshold level of the peaking amplifier 341, the amplifier 300 operates in a high-power mode in which the main amplifier 340 and the peaking amplifier 341 both supply current to the load 390. At this point, the peaking amplifier 341 provides active load modulation at combining node 380, allowing the current of the main amplifier 340 to continue to increase linearly.

Input and output impedance matching networks 310, 350 (input MNm, output MNm) may be implemented at the input and/or output of the main amplifier 340. Similarly, input and output impedance matching networks 311, 351 (input MNp, output MNp) may be implemented at the input and/or output of the peaking amplifier 341. In each case, the matching networks 310, 311, 350, 351 may be used to incrementally increase the circuit impedance toward the load impedance and source impedance. All or portions of the input and output impedance matching networks 310, 311, 350, 351 may be implemented inside a power transistor package that includes the main and/or peaking amplifiers 340, 341, or some portions of the input and output impedance matching networks 310, 311, 350, 351 may be implemented on a PCB or other substrate to which a power transistor package is mounted.

In addition, as will be described in detail later, embodiments of the inventive subject matter include harmonic frequency termination circuits 330, 331 coupled between the inputs of amplifiers 340, 341 and a ground reference. Still other embodiments of the inventive subject matter include harmonic frequency termination circuits 370, 371 coupled between the outputs of amplifiers 340, 341 and a ground reference. The harmonic frequency termination circuits 330, 331, 370, 371 are configured to control the harmonic impedance across a relatively wide fractional bandwidth. For example, the harmonic frequency termination circuits 330, 331, 370, 371 may provide a low impedance path to ground for signal energy at the second harmonic of the center frequency of operation, fo, of the amplifier 300 (also referred to herein as the "fundamental frequency" of operation).

Doherty amplifier 300 has a "non-inverted" load network configuration. In the non-inverted configuration, the input circuit is configured so that an input signal supplied to the peaking amplifier 341 is delayed by 90 degrees with respect to the input signal supplied to the main amplifier 340 at the center frequency of operation, fo, of the amplifier 300. To ensure that the main and peaking input RF signals arrive at the main and peaking amplifiers 340, 341 with about 90 degrees of phase difference, as is fundamental to proper Doherty amplifier operation, phase delay element 382 applies about 90 degrees of phase delay to the peaking input signal. For example, phase delay element 382 may include a quarter wave transmission line, or another suitable type of delay element with an electrical length of about 90 degrees.

To compensate for the resulting 90 degree phase delay difference between the main and peaking amplifier paths 320, 321 at the inputs of amplifiers 340, 341 (i.e., to ensure that the amplified signals arrive in phase at the combining node 380), the output circuit is configured to apply about a 90 degree phase delay to the signal between the output of main amplifier 340 and the combining node 380. This is achieved through an additional delay element 384. Alternate embodiments of Doherty amplifiers may have an "inverted" load network configuration. In such a configuration, the input circuit is configured so that an input signal supplied to the main amplifier 340 is delayed by about 90 degrees with respect to the input signal supplied to the peaking amplifier 341 at the center frequency of operation, fo, of the amplifier 300, and the output circuit is configured to apply about a 90 degree phase delay to the signal between the output of peaking amplifier 341 and the combining node 380.

Amplifiers 340 and 341, along with harmonic frequency termination circuits 330, 331, 370, 371 and portions of matching networks 310, 311, 350, 351 may be implemented in discrete, packaged power amplifier devices. In such devices, input and output leads are coupled to a substrate, and each amplifier 340, 341 may include a single-stage or multi-stage power transistor also coupled to the substrate. Portions of the harmonic frequency termination circuits 330, 331, 370, 371 and the input and output matching networks 310, 311, 350, 351 may be implemented as additional components within the packaged device. Further, as is described in detail below, the video bandwidth circuits (e.g., embodiments of VBW circuits 160, 162, FIG. 1, illustrated in FIGS. 2A-2F) also may be implemented as additional components within the packaged device.

Figure 4:
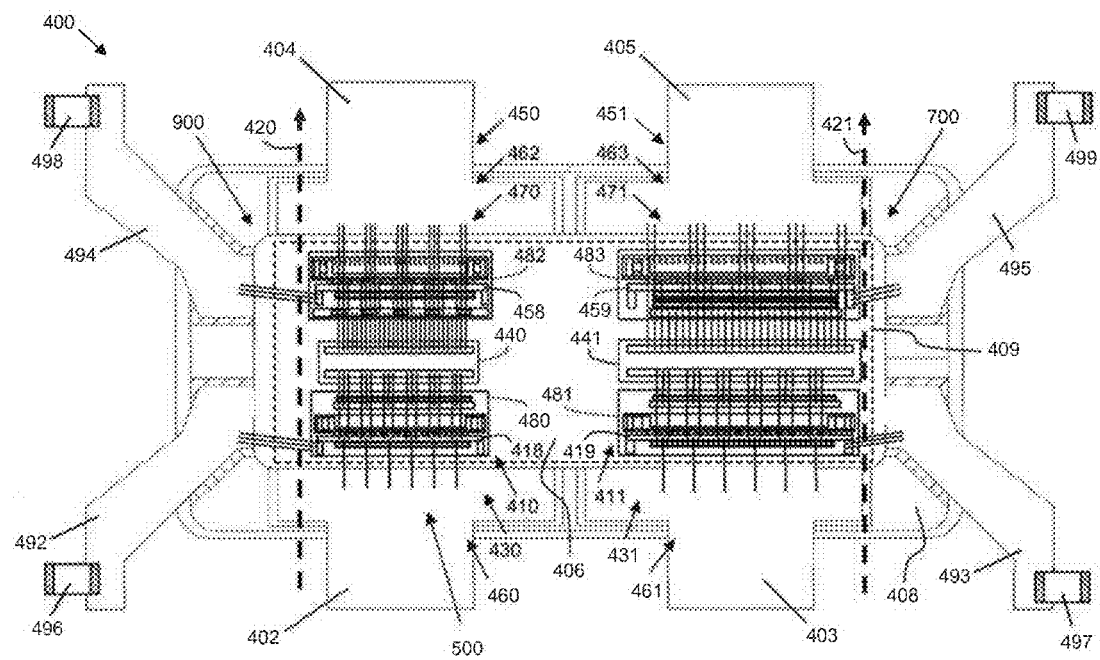
FIG. 4 is a top view of a packaged RF power amplifier device that includes two parallel amplification paths, in accordance with an example embodiment.

For example, FIG. 4 is a top view of an embodiment of a packaged RF amplifier device 400 that embodies two parallel instances of the circuit 100 of FIG. 1, and which may be utilized to provide amplifiers (e.g., amplifiers 340, 341, FIG. 3), and portions of matching networks (e.g., portions of matching networks 310, 311, 350, 351, FIG. 3) in a Doherty amplifier (e.g., Doherty amplifier 300, FIG. 3). In addition, as will be described in more detail below, device 400 includes two input-side IPD assemblies 480, 481, each of which includes portions of an input impedance matching circuit 410, 411 (e.g., circuit 110, 310, 311 FIGS. 1, 3), a video bandwidth circuit 460, 461 (e.g., circuit 160, FIG. 1), and a harmonic termination circuit 430, 431 (e.g., circuit 130, 330, 331, FIGS. 1, 3). Further, device 400 includes two output-side IPD assemblies 482, 483, each of which includes portions of an output impedance matching circuit 450, 451 (e.g., circuit 150, 350, 351 FIGS. 1, 3), a video bandwidth circuit 462, 463 (e.g., circuit 162, FIG. 1), and a harmonic termination circuit 470, 471 (e.g., circuit 170, 370, 371, FIGS. 1, 3).

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for transistor dies 440, 441 and other devices mounted on flange 406. Flange 406 has top and bottom surfaces (only a central portion of the top surface is visible in FIG. 4), and a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system. At least the top surface of flange 406 is formed from a layer of conductive material, and possibly all of flange 406 is formed from bulk conductive material.

An isolation structure 408 is attached to the top surface of flange 406, in an embodiment. Isolation structure 408, which is formed from a rigid, electrically insulating material, provides electrical isolation between conductive features of the device (e.g., between leads 402-405 and flange 406). Isolation structure 408 has a frame shape, in an embodiment, which includes a substantially enclosed, four-sided structure with a central opening. Isolation structure 408 may have a substantially rectangular shape, as shown in FIG. 4, or isolation structure 408 may have another shape (e.g., annular ring, oval, and so on).

A portion of the top surface of flange 406 that is exposed through the opening in isolation structure 408 is referred to herein as the "active area" of device 400. Transistor dies 440, 441 are positioned within the active device area of device 400, along with IPD assemblies 480, 481, 482, 483, which will be described in more detail later. For example, the transistor dies 440, 441 and IPD assemblies 480-483 may be coupled to the top surface of flange 406 using conductive epoxy, solder, solder bumps, sintering, and/or eutectic bonds.

Device 400 houses two amplification paths (indicated with arrows 420, 421), where each amplification path 420, 421 represents a physical implementation of circuit 100 (FIG. 1). When incorporated into a Doherty amplifier (e.g., Doherty amplifier 300, FIG. 3), amplification path 420 may correspond to a main amplifier path (e.g., main amplifier path 320, FIG. 3), and amplification path 421 may correspond to a peaking amplifier path (e.g., peaking amplifier path 321, FIG. 3).

Each path 420, 421 includes an input lead 402, 403 (e.g., input 102, FIG. 1), an output lead 404, 405 (e.g., output 104, FIG. 1), one or more transistor dies 440, 441 (e.g., transistor 140, FIG. 1 or amplifiers 340, 341, FIG. 3), an input impedance matching circuit 410, 411 (e.g., input impedance matching circuit 110, FIG. 1 or portions of input matching networks 310, 311, FIG. 3), an output impedance matching circuit 450, 451 (e.g., output impedance matching circuit 150, FIG. 1 or portions of output matching networks 350, 351, FIG. 3), an input-side video bandwidth circuit 460, 461 (e.g., video bandwidth circuit 160, FIG. 1), an output-side video bandwidth circuit 462, 463 (e.g., video bandwidth circuit 162, FIG. 1), an input-side harmonic termination circuit 430, 431 (e.g., harmonic termination circuit 130, 330, 331, FIGS. 1, 3), and an output-side harmonic termination circuit 470, 471 (e.g., harmonic termination circuit 170, 370, 371, FIGS. 1, 3).

The input and output leads 402-405 are mounted on a top surface of the isolation structure 408 on opposed sides of the central opening, and thus the input and output leads 402-405 are elevated above the top surface of the flange 406, and are electrically isolated from the flange 406. Generally, the input and output leads 402-405 are oriented to allow for attachment of bondwires between the input and output leads 402-405 and components and elements within the central opening of isolation structure 408.

Each transistor die 440, 441 includes an integrated power FET, where each FET has a control terminal (e.g., a gate) and two current conducting terminals (e.g., a drain and a source). A control terminal of a FET within each transistor die 440, 441 is coupled through an input impedance matching circuit 410, 411 to an input lead 402, 403. In addition, one current conducting terminal (e.g., the drain) of a FET within each transistor die 440, 441 is coupled through an output impedance matching circuit 450, 451 to an output lead 404, 405. The other current conducting terminal (e.g., the source) of a FET within each transistor die 440, 441 is electrically coupled through the die 440, 441 to the flange 406 (e.g., to ground), in an embodiment.

Embodiments of the input impedance matching circuits 410, 411, video bandwidth circuits 460, 461, and harmonic termination circuits 430, 431 will be described in more detail later in conjunction with FIGS. 5 and 6, which illustrate the components of these circuits 410, 411, 430, 431, 460, 461 in greater detail. As will be explained in conjunction with FIGS. 5 and 6, some of the components of these circuits may be implemented within IPD assemblies 480, 481. Briefly, each input impedance matching circuit 410, 411 is coupled between an input lead 402, 403 and the control terminal of a FET within a transistor die 440, 441. Each input-side video bandwidth circuit 460, 461 is coupled between a node 418, 419 (e.g., a conductive bond pad) within IPD assembly 480, 481 and a ground reference (e.g., flange 406). Each harmonic termination circuit 430, 431 is coupled between the control terminal (e.g., the gate) of a FET within a transistor die 440, 441 and the ground reference (e.g., flange 406).

Embodiments of the output impedance matching circuits 450, 451, video bandwidth circuits 462, 463, and harmonic termination circuits 470, 471 will be described in more detail in conjunction with FIGS. 7-9, which illustrate the components of these circuits 450, 451, 462, 463, 470, 471 in greater detail. As will be explained in conjunction with FIGS. 7-9, some of the components of these circuits may be implemented within IPD assemblies 482, 483. Briefly, each output impedance matching circuit 450, 451 is coupled between a current conducting terminal (e.g., the drain) of a FET within a transistor die 440, 441 and an output lead 404, 405. Each video bandwidth circuit 462, 463 is coupled between a node 458, 459 (e.g., an RF low-impedance point in the form of a conductive bond pad) within IPD assembly 482, 483 and a ground reference (e.g., flange 406). Each harmonic termination circuit 470, 471 is coupled between the current conducting terminal (e.g., the drain) of a FET within a transistor die 440, 441 and the ground reference (e.g., flange 406).

In addition to the input and output leads 402-405, device 400 also may include bias circuitry (e.g., corresponding to bias circuits 190, 191, FIG. 1). The bias circuits each include an inductive element (e.g., inductive elements 192, 194, FIG. 1) and a capacitor 496, 497, 498, 499 (e.g., capacitors 196, 198, FIG. 1). The inductive element of each bias circuit may include, for example, a series-coupled arrangement of a bias lead 492, 493, 494, 495 and bondwires (e.g., bondwires 590, 790, 990, FIGS. 5, 7, 9) coupling each bias lead 492-495 to a control terminal (e.g., the gate) or to a current conducting terminal (e.g., the drain) of a FET within each transistor die 440, 441. The distal end of each bias lead 492-495 (near each capacitor 496-499, and represented in FIG. 1 as nodes 193, 195) may be electrically coupled to an external bias circuit (not shown), which provides a bias voltage to the control terminal or current conducting terminal of each FET through the bias lead 492-495. In other embodiments, either or both the input-side or output-side bias circuits may be excluded. In such embodiments, the external bias circuits may be connected instead to the input leads 402, 403 or to the output leads 404, 405 and the bias voltage(s) may be provided through the input leads 402, 403 and/or the output leads 404, 405.

In the example of FIG. 4, device 400 includes two transistor dies 440, 441 that essentially function in parallel, although another semiconductor device may include a single transistor die or more than two transistor dies, as well. In addition, device 400 includes two input-side IPD assemblies 480, 481 and two output-side IPD assemblies 482, 483, which also essentially function in parallel. It is to be understood that more or fewer of IPD assemblies 480-483 may be implemented, as well.

According to an embodiment, device 400 is incorporated in an air cavity package, in which transistor dies 440, 441, the IPD assemblies 480-483, and various other components are located within an enclosed air cavity. Basically, the air cavity is bounded by flange 406, isolation structure 408, and a cap (not shown) overlying and in contact with the isolation structure 408 and leads 402-405. In FIG. 4, an example perimeter of the cap is indicated by dashed box 409. In other embodiments, the components of device 400 may be incorporated into an overmolded package (i.e., a package in which the electrical components within the active device area are encapsulated with a non-conductive molding compound, and in which portions of the leads 402-405 also may be encompassed by the molding compound). In an overmolded package, isolation structure 408 may be excluded.

Figure 5:
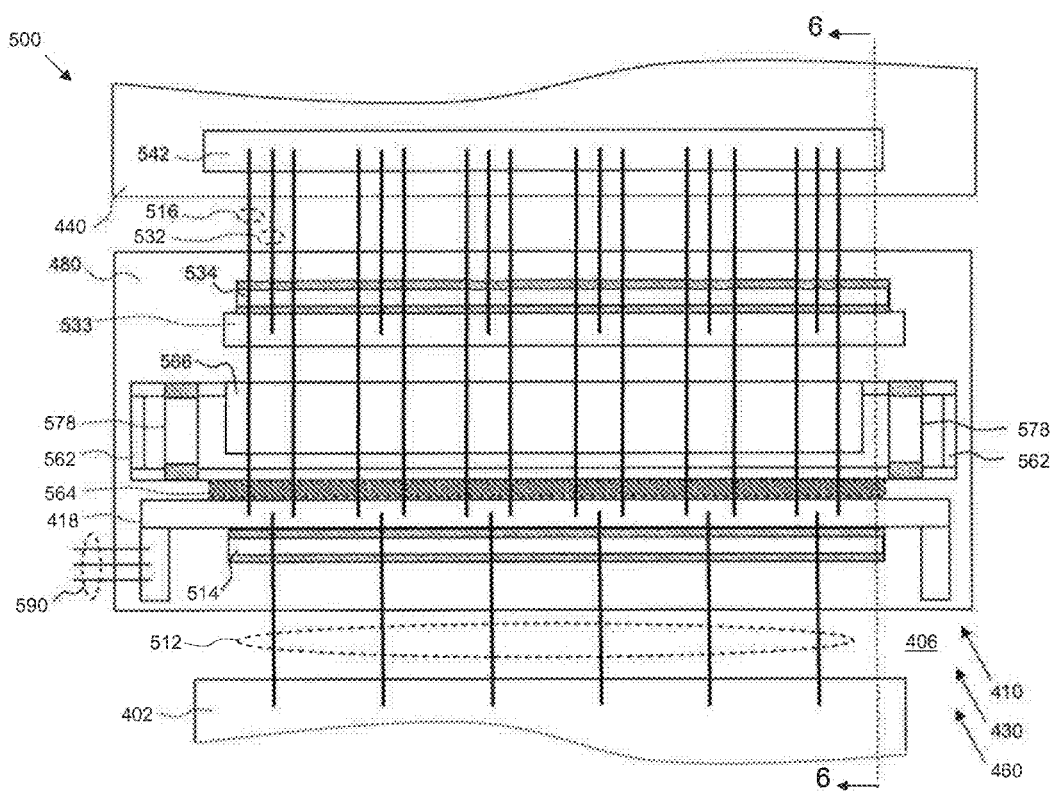
FIG. 5 is a top view of a portion of a packaged RF power amplifier device, including a portion of a power transistor and an input impedance matching circuit, in accordance with an example embodiment.
Figure 6:
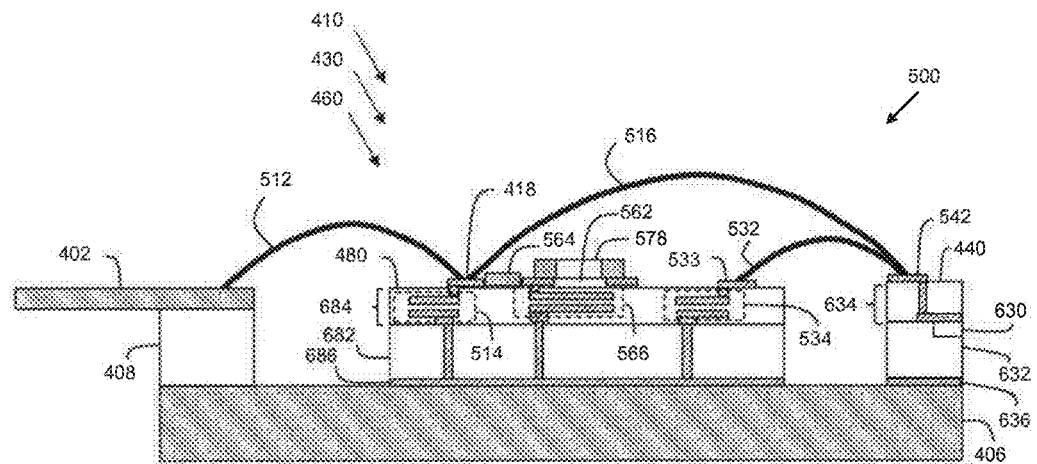
FIG. 6 is a cross-sectional, side view of the portion of the RF power amplifier device of FIG. 5 along line 6-6, in accordance with an example embodiment.

Reference is now made to FIGS. 5 and 6, which include enlarged views of portions of device 400 (FIG. 4) that include embodiments of input impedance matching circuits 410, video bandwidth circuit 460, and harmonic termination circuit 430. More specifically, FIG. 5 is a top view of the lower-left, input-side portion 500 of packaged RF power amplifier device 400 along amplifier path 420. Portion 500 (FIG. 5) includes a portion of power transistor die 440, a portion of input lead 402, and input-side IPD assembly 480. For enhanced understanding, FIG. 6 includes a cross-sectional, side view of the portion 500 of the RF power amplifier device of FIG. 5 along line 6-6, in accordance with an example embodiment. More specifically, FIG. 6 is a cross-sectional view through input lead 402, IPD assembly 480, a portion of flange 406, and transistor die 440. As indicated in FIG. 6, the power transistor die 440 and the IPD assembly 480 are coupled to the conductive flange 406, and the input lead 402 is electrically isolated from the conductive flange 406 (e.g., using an isolation structure 408). It should be noted that the input-side portion of the device 400 along amplifier path 421 may be substantially the same as portion 500 shown in FIGS. 5 and 6.

The power transistor die 440 includes a transistor input terminal 542 (e.g., a conductive bond pad), which is electrically connected within the power transistor die 440 to a control terminal (e.g., a gate terminal) of a single-stage or final-stage FET 630 integrated within the die 440. As discussed previously, each FET 630 may include a III-V field effect transistor (e.g., a HEMT), such as a GaN FET (or another type of III-V transistor, including a GaAs FET, a GaP FET, an InP FET, or an InSb FET). More specifically, each FET 630 may be integrally formed in and on a base semiconductor substrate 632 (e.g., a GaN substrate, a GaN-on-silicon substrate, a GaN-on-silicon carbide substrate, and so on). Conductive connections between the control terminal of the FET 630 (e.g., the gate terminal) and the input terminal 542 of the die 440 may be made through a build-up structure 634 of alternating dielectric and patterned conductive layers, where portions of the patterned conductive layers are electrically connected using conductive vias. A conductive layer 636 on a bottom surface of the die 440 may provide a ground node (e.g., for the source terminal, which may be connected to the conductive layer 636 (and thus to the conductive flange 406) using through substrate vias or doped sinker regions (not shown).

The IPD assembly 480 also may include a base semiconductor substrate 682 (e.g., a silicon substrate, a silicon carbide substrate, a GaN substrate, or another type of semiconductor substrate, which may be referred to as an "IPD substrate" herein) and a build-up structure 684 of alternating dielectric and patterned conductive layers, where portions of the patterned conductive layers are electrically connected using conductive vias. As will be discussed in more detail below, various electrical components of the input impedance matching circuit 410, the video bandwidth circuit 460, and the harmonic termination circuit 430 are integrally formed within and/or connected to the IPD assembly 480. These electrical components may be electrically connected to conductive bond pads (e.g., bond pads 418, 533) at the top surface of the IPD assembly 480, and also may be electrically connected to the conductive flange 406 (e.g., to ground) using through substrate vias to a conductive layer 686 on a bottom surface of the IPD assembly 480.

In some embodiments, the input-side IPD assembly 480 more specifically includes a first shunt capacitor 514 (e.g., shunt capacitance 114, FIG. 1) of an input impedance matching circuit (e.g., circuit 110, FIG. 1 or 410, 411, FIG. 4), a second shunt capacitor 534 (e.g., shunt capacitance 134, FIG. 1) of a harmonic termination circuit (e.g., circuit 130, FIG. 1 or 430, 431, FIG. 4), and components of a video bandwidth circuit (e.g., circuit 160, FIG. 1, one of circuits 200-205, FIGS. 2A-2F, or 460, 461). In the embodiments of FIGS. 5 and 6, the components of the video bandwidth circuit included in each IPD assembly 480 more specifically include an envelope resistor 564 (e.g., resistor 264, FIGS. 2A-2F), an envelope inductor 562 (e.g., inductor 262, FIGS. 2A-2F), an envelope capacitor 566 (e.g., capacitor 266, FIGS. 2A-2F), and a bypass capacitor 578 (e.g., bypass capacitor 278, FIG. 2F). Each of these components will be discussed in more detail later.

First, connections between the transistor die 440 and the input lead 402 through the input impedance matching circuit 410 will be described in more detail. More specifically, an input lead 402 is electrically coupled, through an instance of an input impedance matching circuit 410, to the input terminal 542 of the transistor die 440. The input terminal 542, in turn, is electrically coupled to the control terminal (e.g., the gate) of a FET within the transistor die 440. For example, in an embodiment, the input impedance matching circuit 410 may include two inductive elements 512, 516 (e.g., inductive elements 112, 116, FIG. 1) and a shunt capacitor 514 (e.g., shunt capacitance 114, FIG. 1). A first inductive element 512 (e.g., inductive element 152, FIG. 1) may be implemented as a first set of bondwires that are coupled between the input lead 402 and a conductive bond pad 418 on a top surface of the IPD assembly 480. The second inductive element 516 (e.g., inductive element 116, FIG. 1) may be implemented as a second set of bondwires that are coupled between the conductive bond pad 418 and the input terminal 542 of the transistor die 440. To avoid cluttering FIG. 5, only one bondwire in the set of bondwires comprising inductive element 516 is circled and numbered with reference number 516. It should be understood that inductive element 516 includes all bondwires coupled between bond pad 418 and the input terminal 542. For example, the conductive bond pad 418 may correspond to (or be coupled to) an RF low-impedance point node (e.g., node 118, FIG. 1), in an embodiment.

In an embodiment, the first ends of bondwires 590 also may be connected to the conductive bond pad 418, where the second ends of bondwires 590 are connected to a bias lead (e.g., bias lead 492, FIG. 4). When a bias voltage is provided by an external bias circuit to the bias lead, the bias voltage may be conveyed through bondwires 590, conductive landing pad 418, bondwires 516, and conductive landing pad 542 to the gate of the FET within transistor die 440.

According to an embodiment, the shunt capacitor 514 of each input impedance matching circuit 410 may be implemented as a capacitor (or a set of parallel-coupled capacitors) that is integrally formed with the IPD substrate of IPD assembly 480. For example, shunt capacitor 514 may be implemented as an integrated metal-insulator-metal (MIM) capacitor, which includes first and second conductive electrodes (formed from patterned portions of the conductive layers of build-up structure 684) that are aligned with each other and electrically separated by dielectric material of the build-up structure 684. A first electrode (or terminal) of the shunt capacitor 514 is electrically coupled to the conductive bond pad 418 (and thus to bondwires 512, 516), and a second electrode (or terminal) of the shunt capacitor 514 is electrically coupled to the conductive flange (e.g., using conductive through substrate vias that extend through the semiconductor substrate 682), in an embodiment. In a more specific embodiment, the first electrode of the shunt capacitor 514 is "directly connected" to the bond pad 418, where "directly connected" means electrically connected, possibly with one or more conductive traces and/or conductive vias, but without intervening circuit elements (i.e., circuit elements that have more than a trace inductance, where a "trace inductance" is an inductance less than about 100 pH). Because the shunt capacitor 514 and the bond pad 418 are "directly connected," and the bond pad 418 also has only a trace inductance, in an embodiment, the bondwires 512, 516 and the shunt capacitor 514 also may be considered to be "directly connected." In an alternate embodiment, the shunt capacitor 514 may be implemented using a discrete capacitor coupled to a top surface of the IPD assembly 480, or using another type of capacitor.

According to an embodiment, the series combination of inductive elements 512, 516 may have an inductance value in a range between about 50 pH to about 3 nH, and shunt capacitance 514 may have a capacitance value in a range between about 5 pF to about 120 pF, although these components may have values outside of these ranges, as well. In some embodiments, shunt capacitance 514 may have a relatively-large capacitance (e.g., greater than about 60 pF) to provide an acceptable RF low-impedance point.

As mentioned above, a video bandwidth circuit 460 is included in input-side IPD assembly 480, in an embodiment. Each video bandwidth circuit 460 may have any one of a number of configurations, in various embodiments, such as but not limited to one of the configurations illustrated in FIGS. 2A-2F. In the embodiment illustrated in FIGS. 5 and 6, which corresponds to the video bandwidth circuit 205 of FIG. 2F, the video bandwidth circuit 460 includes a series combination of an envelope resistor 564 (e.g., resistor 264, FIG. 2F), an envelope inductor 562 (e.g., inductor 262, FIG. 2F), and an envelope capacitor 566 (e.g., capacitor 266, FIG. 2F) electrically connected between node 418 (e.g., node 118, 218, FIGS. 1, 2F, which may correspond to or be coupled to an RF low-impedance point) and a ground reference (e.g., flange 406). In addition, each video bandwidth circuit 460 includes a bypass capacitor 578 (e.g., bypass capacitor 278, FIG. 2F) connected in parallel with envelope inductor 562. In the embodiments of FIGS. 5 and 6, two instances of the parallel combination of envelope inductor 562 and bypass capacitor 578 are implemented on opposite sides of the IPD assembly 480. More specifically, the parallel combinations of envelope inductor 562 and capacitor 578 are connected in parallel between envelope resistor 564 and envelope capacitor 566, in the illustrated embodiment. In an alternate embodiment, the video bandwidth circuit 460 may include only one instance of the combination of envelope inductor 562 and capacitor 578, or more than two instances of the combination of envelope inductor 562 and capacitor 578.

In the embodiment of FIGS. 5 and 6, envelope resistor 564 is integrally formed as part of the IPD assembly 480. For example, each envelope resistor 564 may be a polysilicon resistor formed from a layer of polysilicon on or within build-up structure 684, and electrically coupled between node 418 and the parallel combination of envelope inductor 562 and bypass capacitor 578. In other alternate embodiments, the envelope resistor 564 may be formed from tungsten silicide or another material, may be a thick or thin film resistor, or may be a discrete component coupled to a top surface of IPD assembly 480.

The envelope inductor 562 also may be integrally formed as part of the IPD assembly 480, as is illustrated in the embodiment of FIGS. 5 and 6. For example, each envelope inductor 562 may be a patterned conductor formed from portion(s) of one or more conductive layers of the build-up structure 684, where a first end of the conductor is electrically coupled to envelope resistor 564, and a second end of the conductor is electrically coupled to a first terminal of envelope capacitor 566. In alternate embodiments, each envelope inductor 562 may be implemented as a plurality of bondwires, or as a spiral inductor (e.g., on or proximate to the top surface of IPD assembly 480), or as a discrete inductor coupled to a top surface of IPD assembly 480.

A bypass capacitor 578 is coupled in parallel with each envelope inductor 562, in an embodiment. Each of the bypass capacitors 578 may be, for example, a discrete capacitor that is connected (e.g., using solder, a conductive epoxy, or other means) to a top surface of IPD assembly 480. More specifically, a first terminal of each bypass capacitor 578 may be electrically coupled to the envelope resistor 564 and to a first terminal of an envelope inductor 562, and a second terminal of each bypass capacitor 578 may be connected to a second terminal of an envelope inductor 562 and to a first terminal of envelope capacitor 566.

For example, each bypass capacitor 578 may be a multiple-layer capacitor (e.g., a multiple-layer ceramic capacitor) with parallel, interleaved electrodes and wrap-around end terminations. Alternatively, each bypass capacitor 578 may form a portion of a separate IPD (e.g., a MIM capacitor formed on a semiconductor substrate), or may be a capacitor that is integrally formed with the semiconductor substrate of the IPD assembly 480. Alternatively, each bypass capacitor 578 may be implemented as some other type of capacitor capable of providing the desired capacitance for the video bandwidth circuit 460.

The envelope capacitor 566 is electrically coupled between a ground reference node (e.g., conductive layer 686 at the bottom surface of each IPD assembly 480) and the parallel combination of envelope inductor 562 and bypass capacitor 578. Capacitor 566 may be a MIM capacitor that is integrally formed with the IPD substrate of IPD assembly 480, for example. In some embodiments, capacitor 566 may be formed in the build-up structure 684 entirely above the semiconductor substrate 682, or capacitor 566 may have portions that extend into the semiconductor substrate 682 or are otherwise coupled to, or in contact with, the semiconductor substrate 682. According to an embodiment, the capacitor 566 may be formed from a first electrode, a second electrode, and a dielectric material between the first and second electrodes. The dielectric material of capacitor 566 may include one or more layers of polysilicon, various oxides, a nitride, or other suitable materials. In various embodiments, the first and second electrodes of capacitor 566 may include horizontal portions of conductive layers (e.g., portions that are parallel to the top and bottom surfaces of IPD assembly 480) and/or vertical portions (e.g., portions that are parallel to the sides of IPD assembly 480) of conductive layers that are interconnected. Further, the first and second electrodes of capacitor 566 may be formed from metal layers and/or from conductive semiconductor materials (e.g., polysilicon). Alternatively, each envelope capacitor 566 may be, for example, a discrete capacitor that is connected (e.g., using solder, a conductive epoxy, or other means) to a top surface of the IPD assembly 480. Although particular two-plate capacitor structures are shown in FIG. 6 for capacitors 514, 534, and 566, a variety of other capacitor structures alternatively may be utilized, as would be understood by one of skill in the art based on the description herein.

As discussed previously in conjunction with FIG. 1, a harmonic termination circuit 430 also is connected between the control terminal (e.g., the gate) of a FET within each transistor die 440 and a ground reference (e.g., to the conductive layer 686 on the bottom surface of IPD assembly 480). In the embodiment of FIGS. 5 and 6, the harmonic termination circuit 430 includes a series combination of a shunt inductance 532 (e.g., shunt inductive element 132, FIG. 1) and a shunt capacitor 534 (e.g., shunt capacitance 134, FIG. 1). The shunt inductance 532 may be implemented as a set of bondwires, where first ends of the bondwires are connected to the input terminal 542 of die 440 (and thus to the control terminal of the FET), and second ends of the bondwires are connected to a conductive bond pad 533 that is exposed at a top surface of IPD assembly 480. To avoid cluttering FIG. 5, only one bondwire in the set of bondwires comprising inductive element 532 is circled and numbered with reference number 532. It should be understood that inductive element 532 includes all bondwires coupled between bond pad 533 and the input terminal 542. Within IPD assembly 480, the bond pad 533 is electrically connected to a first terminal of shunt capacitor 534, and a second terminal of shunt capacitor 534 is electrically connected (e.g., using through substrate vias) to the ground reference (e.g., to the conductive layer 686 on the bottom surface of IPD assembly 480).

According to an embodiment, the shunt capacitor 534 of harmonic termination circuit 430 may be implemented as a capacitor that is integrally formed with the IPD substrate of the IPD assembly 480. For example, shunt capacitor 534 may be implemented as an integrated MIM capacitor, which includes first and second conductive electrodes (formed from patterned portions of the conductive layers of build-up structure 684) that are aligned with each other and electrically separated by dielectric material of the build-up structure 684. A first electrode (or terminal) of the shunt capacitor 534 is electrically coupled to the conductive bond pad 533, and a second electrode (or terminal) of the shunt capacitor 534 is electrically coupled to the conductive flange (e.g., using through substrate vias), in an embodiment. In a more specific embodiment, the first electrode of the shunt capacitor 534 is "directly connected" (as defined previously) to the bond pad 533. Because the shunt capacitor 534 and the bond pad 533 are "directly connected," and the bond pad 533 also has only a trace inductance, in an embodiment, the bondwires 532 and the shunt capacitor 534 also may be considered to be "directly connected." In an alternate embodiment, the shunt capacitor 534 may be implemented using a discrete capacitor coupled to a top surface of the IPD assembly 480, or using another type of capacitor.

According to an embodiment, the harmonic termination circuit 430 functions as low impedance path to ground for signal energy at a harmonic frequency (e.g., a second harmonic of a fundamental frequency of operation of device 400). More specifically, the component values for the shunt inductance 532 and the shunt capacitance 534 are selected so that the series combination of the shunt inductance 532 and shunt capacitance 534 resonate at or near the second harmonic frequency. For example, the fundamental frequency of operation of device 400 may be in a range of about 800 megahertz (MHz) to about 6.0 gigahertz (GHz), and thus the second harmonic frequency (and resonant frequency of circuit 430) may be in a range of about 1.6 GHz to about 12.0 GHz. According to an embodiment, inductance 532 may have an inductance value in a range between about 20 pH to about 1 nH, and capacitor 534 may have a capacitance value in a range between about 1 pF to about 100 pF, although these components may have values outside of these ranges, as well. As discussed above in conjunction with FIG. 1, for example, at a fundamental frequency of operation of 2.0 GHz, which has a second harmonic at 4.0 GHz, inductance 532 may have an inductance value of about 120 pH, and capacitor 534 may have a capacitance value of about 12 pF. However, the designed inductance and/or capacitance values may be affected by mutual coupling between bondwires used to implement inductances 516, 532.

More specifically, and according to an embodiment, the bondwires corresponding to inductive elements 516 and 532 are physically configured and arranged, with respect to each other, to exhibit a predictable mutual coupling between adjacent sets of bondwires during operation. More specifically, the bondwire profiles (e.g., the heights and shapes of each set of bondwires) and their proximities to other bondwires result in predictable mutual coupling, during operation, that results in different effective inductance values of the inductive elements 516 and 532, during operation, than the self-inductance values of the inductive elements 516 and 532 when each inductance is taken in isolation (i.e., not affected by mutual inductance from other inductances).

Figure 7:
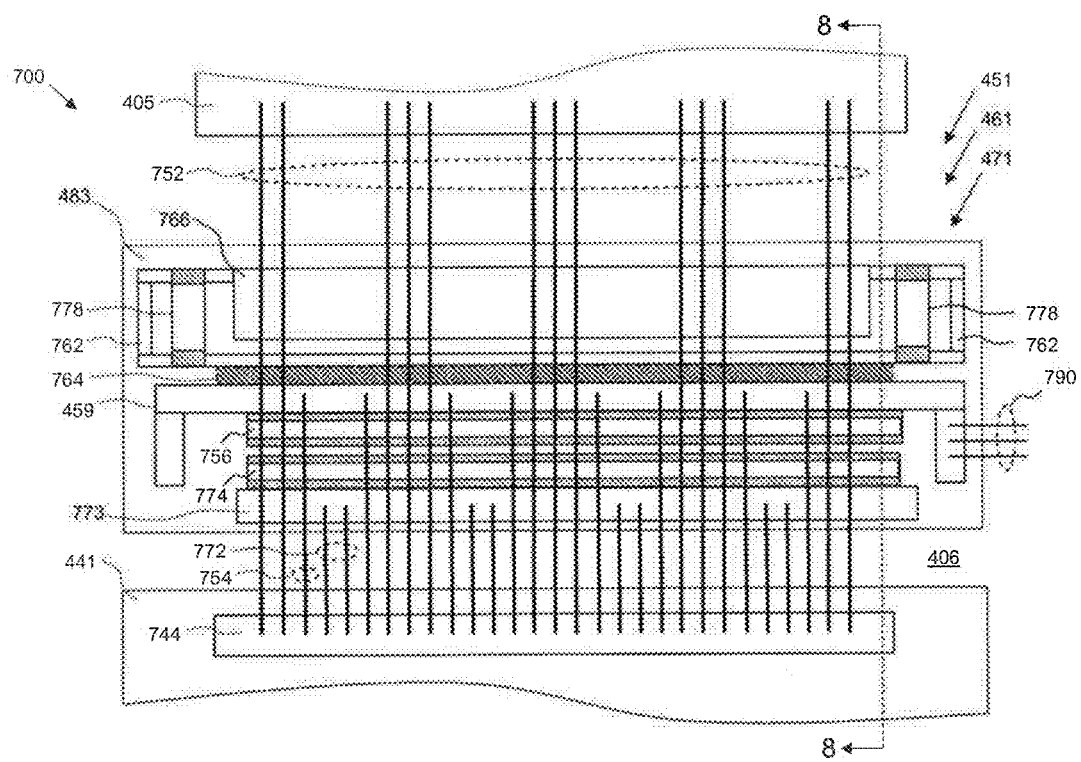
FIG. 7 is a top view of a portion of a packaged RF power amplifier device, including a portion of a power transistor and an output impedance matching circuit, in accordance with an example embodiment.
Figure 8:
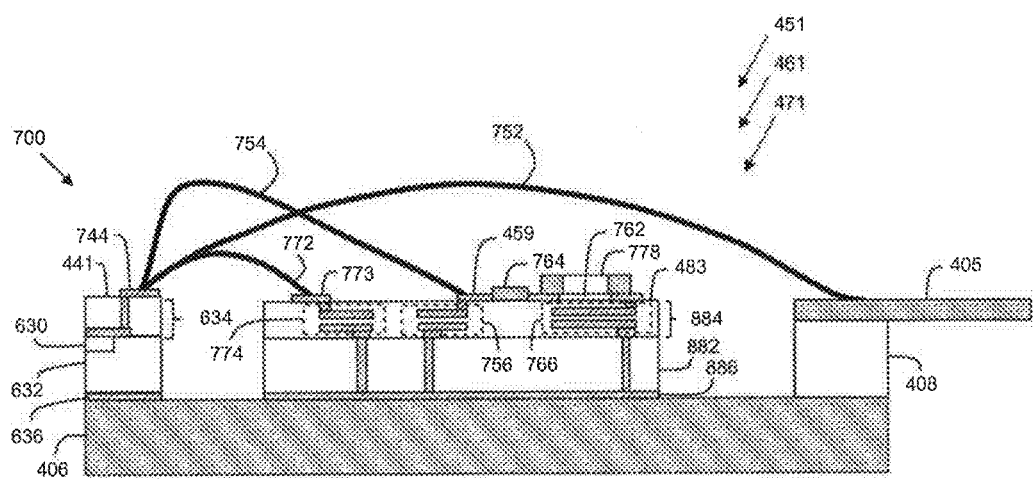
FIG. 8 is a cross-sectional, side view of the portion of the RF power amplifier device of FIG. 7 along line 8-8, in accordance with an example embodiment.
Figure 9:
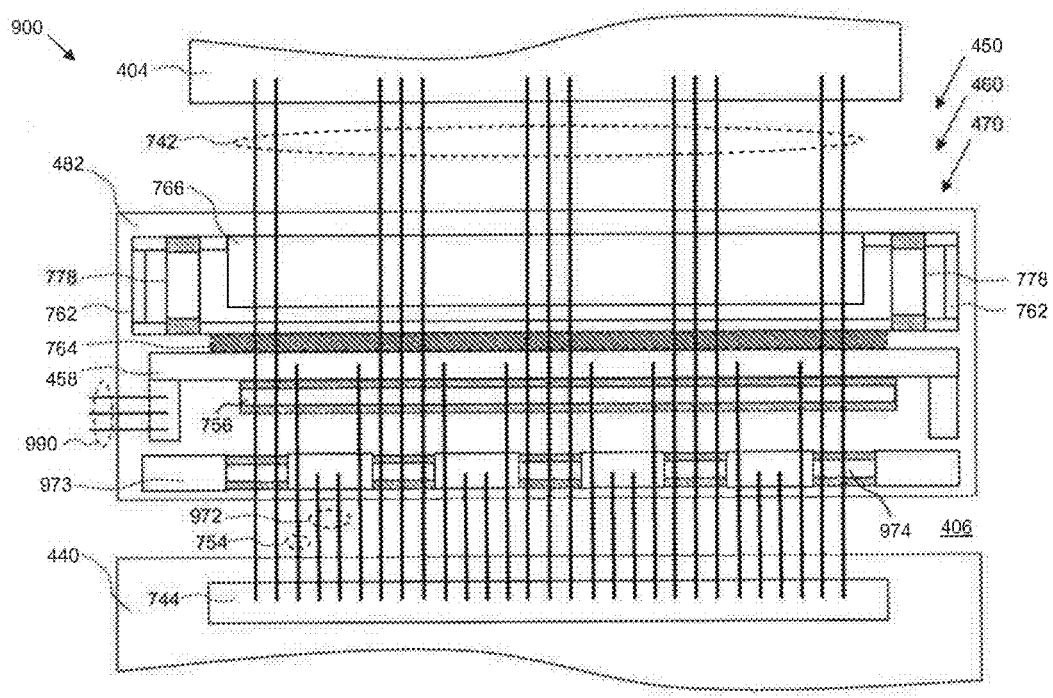
FIG. 9 is a top view of a portion of a packaged RF power amplifier device, including a portion of a power transistor and an output impedance matching circuit, in accordance with another example embodiment.

Reference is now made to FIGS. 7-9, which include enlarged views of portions of device 400 (FIG. 4) that include embodiments of the output impedance matching circuits 450, 451, video bandwidth circuits 462, 463, and harmonic termination circuits 470, 471. More specifically, FIG. 7 is a top view of the upper-right, output-side portion 700 of packaged RF power amplifier device 400 along amplifier path 421, and FIG. 9 is a top view of the upper-left, output-side portion 900 of packaged RF power amplifier device 400 along amplifier path 420. Portion 700 (FIG. 7) includes a portion of power transistor die 441, a portion of output lead 405, and output-side IPD assembly 483. Similarly, portion 900 (FIG. 9) includes a portion of power transistor die 440, a portion of output lead 404, and output-side IPD assembly 482, in accordance. For enhanced understanding, FIG. 8 includes a cross-sectional, side view of the portion 700 of the RF power amplifier device of FIG. 7 along line 8-8, in accordance with an example embodiment. More specifically, FIG. 8 is a cross-sectional view through a portion of flange 406, transistor die 441, IPD assembly 483, and output lead 405.

As will be explained in more detail later, the embodiments of FIGS. 7 and 9 differ primarily in the configuration of the IPD assemblies 482, 483, and more specifically in the configuration of integrated capacitors (e.g., capacitors 774, 974, FIGS. 7, 9) utilized in the harmonic termination circuits 470, 471. The other substantially similar components of the IPD assemblies 482, 483 of FIGS. 7 and 9 are labeled with identical reference numbers, and for the purpose of brevity, the description of those substantially similar components are not repeated. Further, although FIGS. 4 and 7-9 depict embodiments of two differently-configured IPDs 482, 483 utilized in device 400, those of skill in the art would understand, based on the description herein, that a device may include substantially similar IPDs in both amplification paths 420, 421. In other words, an alternate embodiment of device 400 may include output-side IPDs in both paths 420, 421 that have the configuration of IPD 482, or another alternate embodiment of device 400 may include output-side IPDs in both paths 420, 421 that have the configuration of IPD 483.

As mentioned above, each of FIGS. 7-9 show a portion of a power transistor die 440, 441, a portion of an output lead 404, 405, and an output-side IPD assembly 482, 483. As also discussed previously, and as most clearly illustrated in FIG. 8, the power transistor die 440, 441 and the IPD assemblies 482, 483 are coupled to a conductive flange 406, and the output leads 404, 405 are electrically isolated from the conductive flange 406 (e.g., using an isolation structure 408).

Each power transistor die 440, 441 includes a transistor output terminal 744 (e.g., a conductive bond pad), which is electrically connected within each power transistor die 440, 441 to a first current-conducting terminal (e.g., a drain terminal) of a single-stage or final-stage FET 630 integrated within the die 440, 441. Conductive connections between the first current-conducting terminal of the FET 630 (e.g., the drain terminal) and the output terminal 744 of the die 440, 441 may be made through the build-up structure 634.

As with input-side IPD assemblies 480, 481, each output-side IPD assembly 482, 483 also may include an IPD substrate 882 (e.g., a silicon substrate, a silicon carbide substrate, a GaN substrate, or another type of semiconductor substrate) and a build-up structure 884 of alternating dielectric and patterned conductive layers, where portions of the patterned conductive layers are electrically connected using conductive vias. As will be discussed in more detail below, various electrical components of the output impedance matching circuits 450, 451, the video bandwidth circuits 462, 463, and the harmonic termination circuits 470, 471 are integrally formed within and/or connected to the IPD assemblies 482, 483. These electrical components may be electrically connected to conductive bond pads (e.g., bond pads 458, 773, 973) at the top surface of the IPD assemblies 482, 483, and also may be electrically connected to the conductive flange 406 (e.g., to ground) using through substrate vias to a conductive layer 886 on a bottom surface of the IPD assembly 482, 483.

In some embodiments, each IPD assembly 482, 483 more specifically includes a first shunt capacitor 756 (e.g., shunt capacitance 156, FIG. 1) of an output impedance matching circuit (e.g., circuit 150, FIG. 1 or 450, 451, FIG. 4), a second shunt capacitor 774 (e.g., shunt capacitance 174, FIG. 1) of a harmonic termination circuit (e.g., circuit 170, FIG. 1 or 470, 471, FIG. 4), and components of a video bandwidth circuit (e.g., circuit 162, FIG. 1, one of circuits 200-205, FIGS. 2A-2F, or 462, 463). In the embodiments of FIGS. 7-9, the components of the video bandwidth circuit included in each IPD assembly 482, 483 more specifically include an envelope resistor 764 (e.g., resistor 264, FIGS. 2A-2F), an envelope inductor 762 (e.g., inductor 262, FIGS. 2A-2F), an envelope capacitor 766 (e.g., capacitor 266, FIGS. 2A-2F), and a bypass capacitor 778 (e.g., bypass capacitor 278, FIG. 2F). Each of these components will be discussed in more detail later.

First, connections between the transistor dies 440, 441 and the output leads 404, 405 through the output impedance matching circuits 450, 451 will be described in more detail. More specifically, through the output terminal 744, the first current conducting terminal (e.g., the drain) of a FET within each transistor die 440, 441 is electrically coupled to an output lead 404, 405 through an instance of an output impedance matching circuit 450, 451. For example, in an embodiment, each output impedance matching circuit 450, 451 may include two inductive elements 752, 754 (e.g., inductive elements 152, 154, FIG. 1) and a shunt capacitor 756 (e.g., shunt capacitance 156, FIG. 1). A first inductive element 752 (e.g., inductive element 152, FIG. 1) may be implemented as a first set of bondwires that are coupled between the output terminal 744 of each die 440, 441 and an output lead 404, 405. A second inductive element 754 (e.g., inductive element 154, FIG. 1) may be implemented as a second set of bondwires that are coupled between the output terminal 744 of each die 440, 441 and a conductive bond pad 458, 459 on a top surface of the IPD assembly 482, 483. To avoid cluttering FIGS. 7 and 9, only one bondwire in the set of bondwires comprising inductive element 754 is circled and numbered with reference number 754. It should be understood that inductive element 754 includes all bondwires coupled between bond pad 458, 459 and the output terminal 744. For example, the conductive bond pads 458, 459 may correspond to RF low-impedance point nodes (e.g., node 158, FIG. 1), in an embodiment.

In an embodiment, the first ends of bondwires 790, 990 also may be connected to the conductive bond pad 458, 459, where the second ends of bondwires 790, 990 are connected to a bias lead (e.g., bias lead 494, 495, FIG. 4). When a bias voltage is provided by an external bias circuit to the bias lead, the bias voltage may be conveyed through bondwires 790, 990, conductive landing pad 458, 459, bondwires 754, and conductive landing pad 744 to the drain of the FET within a transistor die 440, 441.

According to an embodiment, the shunt capacitor 756 of each output impedance matching circuit 450, 451 may be implemented as a capacitor (or a set of parallel-coupled capacitors) that is integrally formed with the IPD substrate of IPD assembly 482, 483. For example, shunt capacitor 756 may be implemented as an integrated MIM capacitor, which includes first and second conductive electrodes (formed from patterned portions of the conductive layers of build-up structure 884) that are aligned with each other and electrically separated by dielectric material of the build-up structure 884. A first electrode (or terminal) of the shunt capacitor 756 is electrically coupled to the conductive bond pad 458, 459 (and thus to bondwires 754), and a second electrode (or terminal) of the shunt capacitor 756 is electrically coupled to the conductive flange (e.g., using conductive through substrate vias that extend through the semiconductor substrate 882), in an embodiment. In a more specific embodiment, the first electrode of the shunt capacitor 756 is "directly connected" (as defined previously) to the bond pad 458. Because the shunt capacitor 756 and the bond pad 458 are "directly connected," and the bond pad 458 also has only a trace inductance, in an embodiment, the bondwires 754 and the shunt capacitor 756 also may be considered to be "directly connected." In an alternate embodiment, the shunt capacitor 756 may be implemented using a discrete capacitor coupled to a top surface of the IPD assembly 482, 483, or using another type of capacitor.

As just explained, the shunt inductor 754 and the shunt capacitor 756 are electrically coupled in series between a current conducting terminal of the power transistor within die 440, 441 and the flange 406 (e.g., ground). As mentioned previously in conjunction with FIG. 1, this combination of impedance matching elements may function as a first (high-pass) matching stage. According to an embodiment, shunt inductor 754 may have an inductance value in a range between about 100 pH to about 3 nH, and shunt capacitor 756 may have a capacitance value in a range between about 30 pF to about 500 pF, although these components may have values outside of these ranges, as well.

As mentioned above, a video bandwidth circuit 462, 463 is included in each IPD assembly 482, 483, in an embodiment. Each video bandwidth circuit 462, 463 may have any one of a number of configurations, in various embodiments, such as but not limited to one of the configurations illustrated in FIGS. 2A-2F. In the embodiment illustrated in FIGS. 7-9, which corresponds to the video bandwidth circuit 205 of FIG. 2F, each video bandwidth circuit 462, 463 includes a series combination of an envelope resistor 764 (e.g., resistor 264, FIG. 2F), an envelope inductor 762 (e.g., inductor 262, FIG. 2F), and an envelope capacitor 766 (e.g., capacitor 266, FIG. 2F) electrically connected between node 458, 459 (e.g., node 158, 218, FIGS. 1, 2F, which may correspond to an RF low-impedance point) and a ground reference (e.g., flange 406). In addition, each video bandwidth circuit 462, 463 includes a bypass capacitor 778 (e.g., bypass capacitor 278, FIG. 2F) connected in parallel with envelope inductor 762. In the embodiments of FIGS. 7-9, two instances of the parallel combination of envelope inductor 762 and bypass capacitor 778 are implemented on opposite sides of the IPD assemblies 482, 483. More specifically, the parallel combinations of envelope inductor 762 and capacitor 778 are connected in parallel between envelope resistor 764 and envelope capacitor 766, in the illustrated embodiment. In an alternate embodiment, the video bandwidth circuits 462, 463 may include only one instance of the combination of envelope inductor 762 and capacitor 778, or more than two instances of the combination of envelope inductor 762 and capacitor 778.

In the embodiments of FIGS. 7-9, envelope resistor 764 is integrally formed as part of the IPD assembly 482, 483. For example, each envelope resistor 764 may be a polysilicon resistor formed from a layer of polysilicon on or within build-up structure 884, and electrically coupled between node 458, 459 and the parallel combination of envelope inductor 762 and bypass capacitor 778. In other alternate embodiments, the envelope resistor 764 may be formed from tungsten silicide or another material, may be a thick or thin film resistor, or may be a discrete component coupled to a top surface of IPD assembly 482, 483.

The envelope inductor 762 also may be integrally formed as part of the IPD assembly 482, 483, as is illustrated in the embodiment of FIGS. 7-9. For example, each envelope inductor 762 may be a patterned conductor formed from portion(s) of one or more conductive layers of the build-up structure 884, where a first end of the conductor is electrically coupled to envelope resistor 764, and a second end of the conductor is electrically coupled to a first terminal of envelope capacitor 766. In alternate embodiments, each envelope inductor 762 may be implemented as a plurality of bondwires, or as a spiral inductor (e.g., on or proximate to the top surface of IPD assembly 482, 483), or as a discrete inductor coupled to a top surface of IPD assembly 482, 483.

A bypass capacitor 778 is coupled in parallel with each envelope inductor 762, in an embodiment. Each of the bypass capacitors 778 may be, for example, a discrete capacitor that is connected (e.g., using solder, a conductive epoxy, or other means) to a top surface of IPD assembly 482, 483. More specifically, a first terminal of each bypass capacitor 778 may be electrically coupled to the envelope resistor 764 and to a first terminal of an envelope inductor 762, and a second terminal of each bypass capacitor 778 may be connected to a second terminal of an envelope inductor 762 and to a first terminal of envelope capacitor 766.

For example, each bypass capacitor 778 may be a multiple-layer capacitor (e.g., a multiple-layer ceramic capacitor) with parallel, interleaved electrodes and wrap-around end terminations. Alternatively, each bypass capacitor 778 may form a portion of a separate IPD (e.g., a MIM capacitor formed on a semiconductor substrate), or may be a capacitor that is integrally formed with the semiconductor substrate of the IPD assembly 482, 483. Alternatively, each bypass capacitor 778 may be implemented as some other type of capacitor capable of providing the desired capacitance for the video bandwidth circuit 462, 463.

The envelope capacitor 766 is electrically coupled between a ground reference node (e.g., conductive layer 886 at the bottom surface of each IPD assembly 482, 483) and the parallel combination of envelope inductor 762 and bypass capacitor 778. Capacitor 766 may be a MIM capacitor that is integrally formed with the IPD substrate of IPD assembly 482, 483, for example. In some embodiments, capacitor 766 may be formed in the build-up structure 884 entirely above the semiconductor substrate 882, or capacitor 766 may have portions that extend into the semiconductor substrate 882 or are otherwise coupled to, or in contact with, the semiconductor substrate 882. According to an embodiment, the capacitor 766 may be formed from a first electrode, a second electrode, and a dielectric material between the first and second electrodes. The dielectric material of capacitor 766 may include one or more layers of polysilicon, various oxides, a nitride, or other suitable materials. In various embodiments, the first and second electrodes of capacitor 766 may include horizontal portions of conductive layers (e.g., portions that are parallel to the top and bottom surfaces of IPD assemblies 482, 483) and/or vertical portions (e.g., portions that are parallel to the sides of IPD assemblies 482, 483) of conductive layers that are interconnected. Further, the first and second electrodes of capacitor 766 may be formed from metal layers and/or from conductive semiconductor materials (e.g., polysilicon). Alternatively, each envelope capacitor 766 may be, for example, a discrete capacitor that is connected (e.g., using solder, a conductive epoxy, or other means) to a top surface of the IPD assembly 482, 483. Although particular two-plate capacitor structures are shown in FIG. 8 for capacitors 756, 774, and 766, a variety of other capacitor structures alternatively may be utilized, as would be understood by one of skill in the art based on the description herein.

As discussed previously in conjunction with FIG. 1, a harmonic termination circuit 470, 471 also is connected between the first current conducting terminal (e.g., the drain) of a FET within each transistor die 440, 441 and a ground reference (e.g., to the conductive layer 886 on the bottom surface of IPD assembly 482, 483). In the embodiment of FIGS. 7 and 8, the harmonic termination circuit 471 includes a series combination of a shunt inductance 772 (e.g., shunt inductive element 172, FIG. 1) and a shunt capacitor 774 (e.g., shunt capacitance 174, FIG. 1). The shunt inductance 772 may be implemented as a set of bondwires, where first ends of the bondwires are connected to the output terminal 744 of die 441 (and thus to the first current conducting terminal of the FET), and second ends of the bondwires are connected to a conductive bond pad 773 that is exposed at a top surface of IPD assembly 483. To avoid cluttering FIG. 7, only two bondwires in the set of bondwires comprising inductive element 772 are circled and numbered with reference number 772. It should be understood that inductive element 772 includes all bondwires coupled between the output terminal 744 and bond pad 773. Within IPD assembly 483, the bond pad 773 is electrically connected to a first terminal of shunt capacitor 774, and a second terminal of shunt capacitor 774 is electrically connected (e.g., using through substrate vias) to the ground reference (e.g., to the conductive layer 886 on the bottom surface of IPD assembly 483).

According to an embodiment, the shunt capacitor 774 of harmonic termination circuit 471 may be implemented as a capacitor that is integrally formed with the IPD substrate of the IPD assembly 483. For example, shunt capacitor 774 may be implemented as an integrated MIM capacitor, which includes first and second conductive electrodes (formed from patterned portions of the conductive layers of build-up structure 884) that are aligned with each other and electrically separated by dielectric material of the build-up structure 884. A first electrode (or terminal) of the shunt capacitor 774 is electrically coupled to the conductive bond pad 773, and a second electrode (or terminal) of the shunt capacitor 774 is electrically coupled to the conductive flange (e.g., using through substrate vias), in an embodiment. In a more specific embodiment, the first electrode of the shunt capacitor 774 is "directly connected" (as defined previously) to the bond pad 773. Because the shunt capacitor 774 and the bond pad 773 are "directly connected," and the bond pad 773 also has only a trace inductance, in an embodiment, the bondwires 772 and the shunt capacitor 774 also may be considered to be "directly connected." In an alternate embodiment, the shunt capacitor 774 may be implemented using a discrete capacitor coupled to a top surface of the IPD assembly 483, or using another type of capacitor.

In the embodiment of FIG. 9, the harmonic termination circuit 470 includes a series combination of a shunt inductance 972 (e.g., shunt inductive element 172, FIG. 1) and a plurality of parallel-coupled shunt capacitors 974 (e.g., multiple parallel-coupled shunt capacitors making up shunt capacitance 174, FIG. 1). More specifically, the difference from the embodiment of FIGS. 7 and 8 and the embodiment of FIG. 9 is that, in the embodiment of FIGS. 7 and 8, the harmonic termination circuit 471 included a single shunt capacitor 774, whereas in the embodiment of FIG. 9, the harmonic termination circuit 471 includes multiple, parallel-coupled shunt capacitors 974 that are physically located between adjacent conductive bond pads 973 or next to end bond pads 973.

In the embodiment of FIG. 9, the shunt inductance 972 may be implemented as multiple sets of bondwires, where first ends of the bondwires are connected to the output terminal 744 of die 440 (and thus to the first current conducting terminal of the FET), and second ends of each set of bondwires are connected to one of a plurality of conductive bond pads 973 that are exposed at a top surface of IPD assembly 482. To avoid cluttering FIG. 9, only two bondwires in the set of bondwires comprising inductive element 972 are circled and numbered with reference number 972. It should be understood that inductive element 972 includes all bondwires coupled between the output terminal 744 and bond pads 973. Within IPD assembly 482, each bond pad 973 is electrically connected to a first terminal of one or two shunt capacitors 974 on one or both sides of each bond pad 973, and a second terminal of each shunt capacitor 974 is electrically connected (e.g., using through substrate vias) to the ground reference (e.g., to a conductive layer on the bottom surface of IPD assembly 482).

According to an embodiment, each shunt capacitor 974 of harmonic termination circuit 470 may be implemented as a capacitor that is integrally formed with the IPD substrate of IPD assembly 482. For example, each shunt capacitor 974 may be implemented as an integrated MIM capacitor, which includes first and second conductive electrodes (formed from patterned portions of the conductive layers of the build-up structure of IPD assembly 482) that are aligned with each other and electrically separated by dielectric material of the build-up structure. A first electrode (or terminal) of each shunt capacitor 974 is electrically coupled to a single conductive bond pad 973 or to two adjacent conductive bond pads 973, and a second electrode (or terminal) of each shunt capacitor 974 is electrically coupled to the conductive flange (e.g., using through substrate vias), in an embodiment. In a more specific embodiment, the first electrode of each shunt capacitor 974 is "directly connected" (as defined previously) to one or more bond pads 973. In an alternate embodiment, each shunt capacitor 974 may be implemented using a discrete capacitor coupled to a top surface of the IPD assembly 482, or using another type of capacitor.

According to an embodiment, each harmonic termination circuit 470, 471 functions as low impedance path to ground for signal energy at a harmonic frequency (e.g., a second harmonic of a fundamental frequency of operation of device 400). More specifically, the component values for the shunt inductance 772, 972 and the shunt capacitance 774, 974 are selected so that the series combination of the shunt inductance 772, 972 and shunt capacitance 774, 974 resonate at or near the second harmonic frequency. For example, the fundamental frequency of operation of device 400 may be in a range of about 800 megahertz (MHz) to about 6.0 gigahertz (GHz), and thus the second harmonic frequency (and resonant frequency of circuits 470, 471) may be in a range of about 1.6 GHz to about 12.0 GHz. According to an embodiment, inductance 772, 972 may have an inductance value in a range between about 20 pH to about 1 nH, and capacitor(s) 774, 974 may have a capacitance value in a range between about 1 pF to about 100 pF, although these components may have values outside of these ranges, as well. As discussed above in conjunction with FIG. 1, for example, at a fundamental frequency of operation of 2.0 GHz, which has a second harmonic at 4.0 GHz, each of inductances 772, 972 may have an inductance value of about 140 pH, and each of capacitors 774, 974 may have a capacitance value of about 11 pF. However, the designed inductance and/or capacitance values may be affected by mutual coupling between bondwires used to implement inductances 752, 754, and 972.

More specifically, and according to an embodiment, the bondwires corresponding to inductive elements 752, 754, and 772 (or 972, FIG. 9) are physically configured and arranged, with respect to each other, to exhibit a predictable mutual coupling between adjacent sets of bondwires during operation. More specifically, the bondwire profiles (e.g., the heights and shapes of each set of bondwires) and their proximities to other bondwires result in predictable mutual coupling, during operation, that results in different effective inductance values of the inductive elements 752, 754, and 772, during operation, than the self-inductance values of the inductive elements 752, 754, and 772 when each inductance is taken in isolation (i.e., not affected by mutual inductance from other inductances). For example, at a center frequency of operation of 2.0 GHz, the mutual coupling between inductive elements 752 and 754 may be in a range of about 1 pH to about 150 pH (e.g., about 86 pH), the mutual coupling between inductive elements 752 and 772 may be in a range of about 1 pH to about 100 pH (e.g., about 30 pH), and the mutual coupling between inductive elements 754 and 772 may be in a range of about 1 pH to about 150 pH (e.g., about 69 pH).

As discussed previously in conjunction with FIG. 1, the FET (e.g., FET 630) within each transistor die 440, 441 may have a drain-source capacitance (modeled by capacitor 146 in FIG. 1) that is relatively low (e.g., less than about 0.2 pF/W). If such a FET were used in a conventional device, a relatively high D2 inductance between the transistor output and the shunt capacitor within the output impedance matching circuit would be needed to provide adequate output impedance matching. As discussed previously, a relatively high D2 inductance could be achieved using a series combination of a set of bondwires between the transistor die that includes the FET and an additional series inductance, such as an integrated spiral inductor.

According to an embodiment, the D2 inductance provided between the transistor output and the shunt capacitor within the output impedance matching circuit may be significantly reduced, when compared with a conventional device, with the inclusion of an embodiment of a harmonic termination circuit 570, 571. More specifically, during operation of device 700, each harmonic termination circuit 570, 571 is essentially equivalent to a capacitor at a fundamental frequency of operation of the device 700, with the capacitance value being approximately equivalent to the effective capacitance of series-coupled inductor/capacitor 772/774, or series coupled inductor/capacitor 972/974. Because this shunt capacitance is coupled in parallel with the drain-source capacitance between the transistor output and the ground reference, the equivalent shunt capacitance from the combination of inductor/capacitor 772/774 or inductor/capacitor 972/974 effectively increases the drain-source capacitance of the FET within each transistor die 440, 441. In some embodiments, each shunt capacitance 774, 974 has a capacitance value that effectively increases the drain-source capacitance of the FET to which it is connected by at least 10 percent. As a result of this effective increase in the drain-source capacitance, the D2 inductance between the transistor output and the shunt capacitor within the output impedance matching circuit (e.g., capacitor 756 within circuit 450, 451) may be decreased, when compared with conventional circuits. Accordingly, whereas a conventional circuit may require an additional inductor to provide an inductance that is greater than the inductance provided by the bondwires connected between the transistor die and the shunt capacitor within the output impedance matching circuit, no such additional inductance is included in circuits 450, 451. Instead, in circuits 450, 451, bondwires 754 may be directly connected (as defined previously) to shunt capacitance 756.

FIGS. 4-9 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

Figure 10:
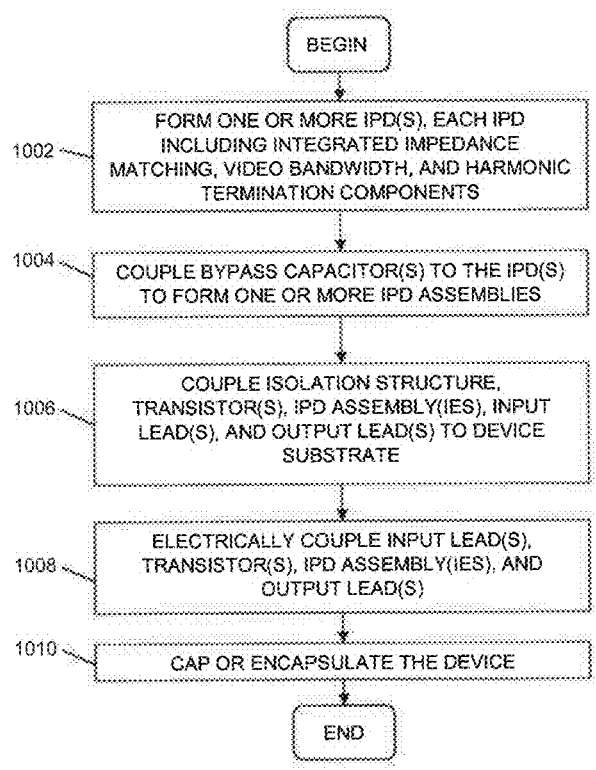
FIG. 10 is a flowchart of a method for fabricating a packaged RF power amplifier device that includes an embodiment of an output impedance matching circuit, in accordance with an example embodiment.

FIG. 10 is a flowchart of a method for fabricating a packaged RF power amplifier device (e.g., device 400, FIG. 4) that includes embodiments of input and output impedance matching circuits, input-side and output-side video bandwidth circuits, and input-side and output-side harmonic termination circuit (e.g., circuits 200-205, 410, 411, 430, 431, 450, 451, 460-463, 470, 471, FIGS. 2A-2F, 4), in accordance with various example embodiments. The method may begin, in blocks 1002-1004, by forming one or more IPD assemblies. More specifically, in block 1002, one or more input and output IPDs (e.g., IPD 480-483, FIGS. 4-9) may be formed. According to an embodiment, each input IPD (e.g., IPDs 480, 481) includes components of an impedance matching circuit, a video bandwidth circuit, and a harmonic termination circuit. For example, each input IPD may include one or more integrated shunt capacitors (e.g., capacitors 514, 534, 566, FIGS. 5, 6), one or more envelope inductive elements (e.g., inductive elements 562, FIGS. 5, 6), and one or more envelope resistors (e.g., resistors 564, FIGS. 5, 6). According to an embodiment, each output IPD (e.g., IPDs 482, 483) also includes components of an impedance matching circuit, a video bandwidth circuit, and a harmonic termination circuit. For example, each output IPD may include one or more integrated shunt capacitors (e.g., capacitors 756, 766, 774, 974, FIGS. 7-9), one or more envelope inductive elements (e.g., inductive elements 762, FIGS. 7-9), and one or more envelope resistors (e.g., resistors 764, FIGS. 7-9). In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes (e.g., nodes 418, 458, 459, 533, 773, 973 FIGS. 4-9) at a surface of each IPD substrate. As discussed previously, the connection nodes may include conductive bond pads, which may accept attachment of inductive elements (e.g., bondwires 512, 516, 532, 754, 772, 790, 990, FIGS. 7-9). In addition, in block 1004, discrete components corresponding to various circuit elements (e.g., bypass capacitors 578, 778, FIGS. 5-9) may be coupled to conductors exposed at the surface of each IPD to form one or more IPD assemblies.

In block 1006, for an air cavity embodiment, an isolation structure (e.g., isolation structure 408, FIG. 4) is coupled to a device substrate (e.g., flange 406). In addition, one or more active devices (e.g., transistors 440, 441) and IPD assemblies (e.g., IPD assemblies 480-483) are coupled to a portion of the top surface of the substrate that is exposed through an opening in the isolation structure. Leads (e.g., input and output leads 402-405, and bias leads 492-495, if included) are coupled to the top surface of the isolation structure. For overmolded (e.g., encapsulated) device embodiments, the isolation structure may be excluded, and the substrate and leads may form portions of a leadframe.

In block 1008, the input lead(s), transistor(s), IPD assembly(ies), and output lead(s) are electrically coupled together. For example, the electrical connections may be made using bondwires between the various device components and elements, as discussed previously. Some of the bondwires correspond to inductive components of input or output matching circuits (e.g., bondwires 512, 516, 752, 754, FIGS. 4-9), and harmonic termination circuits (e.g., bondwires 532, 772, 972, FIGS. 4-9), for example. Finally, in block 1010, the device is capped (e.g., for an air cavity package) or encapsulated (e.g., with mold compound for an overmolded package). The device may then be incorporated into a larger electrical system (e.g., a Doherty amplifier or other type of electrical system).

An embodiment of an RF amplifier has a first amplification path that includes a transistor die and an input-side impedance matching circuit. The transistor die has a transistor and a transistor input terminal. The input-side impedance matching circuit is coupled between the transistor input terminal and an input of the first amplification path. The input-side impedance matching circuit includes an input-side harmonic termination circuit with a first inductive element and a first capacitance connected in series between the transistor input terminal and a ground reference node. The first inductive element includes a first plurality of bondwires, and the input-side harmonic termination circuit resonates at a harmonic frequency of a fundamental frequency of operation of the RF amplifier. The input-side impedance matching circuit also includes a second inductive element and a second capacitance connected in series between the transistor input terminal and the ground reference node, where the second inductive element includes a second plurality of bondwires. Further, the input-side impedance matching circuit also includes a third inductive element connected between the input of the first amplification path and the second capacitance, where the third inductive element includes a third plurality of bondwires.

An embodiment of a packaged RF amplifier device includes a device substrate, a first input lead coupled to the device substrate, a first output lead coupled to the device substrate, a first transistor die coupled to the device substrate, a first integrated passive device coupled to the device substrate, and an input-side impedance matching circuit. The first transistor die includes a first transistor, a transistor input terminal coupled to the first input lead, and a transistor output terminal coupled to the first output lead. The first transistor has a drain-source capacitance below 0.2 picofarads per watt. The input-side impedance matching circuit is coupled between the transistor input terminal and the first input lead, and the input-side impedance matching circuit includes an input-side harmonic termination circuit comprising a first inductive element and a first capacitance connected in series between the transistor input terminal and a ground reference node. The first inductive element includes a first plurality of bondwires connected between the first transistor die and the first integrated passive device, and the input-side harmonic termination circuit resonates at a harmonic frequency of a fundamental frequency of operation of the RF amplifier device. The input-side impedance matching circuit also includes a second inductive element and a second capacitance connected in series between the transistor input terminal and the ground reference node, where the second inductive element includes a second plurality of bondwires. Further, the input-side impedance matching circuit includes a third inductive element connected between the first input lead and the second capacitance, where the third inductive element includes a third plurality of bondwires.

An embodiment of a method of manufacturing an RF amplifier device includes coupling an input lead and an output lead to a device substrate, coupling a transistor die to the device substrate between the input and output leads, and coupling an integrated passive device to the device substrate between the transistor die and the input lead. The transistor die includes a transistor and a transistor output terminal, and the transistor has a drain-source capacitance below 0.2 picofarads per watt. The integrated passive device includes a first capacitance and a second capacitance, where the first capacitance includes a first capacitor that is integrally formed with the integrated passive device, and the second capacitance also is integrally formed with the integrated passive device. The method also includes creating an input-side harmonic termination circuit by connecting a first inductive element in the form of a first plurality of bondwires between the transistor input terminal and the first capacitance, where the input-side harmonic termination circuit resonates at a harmonic frequency of a fundamental frequency of operation of the RF amplifier device. The method also includes creating a portion of an input-side impedance matching circuit by connecting a second inductive element in the form of a second plurality of bondwires between the transistor input terminal and the second capacitance, and connecting a third inductive element in the form of a third plurality of bondwires between the input lead and the second capacitance.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier with a first amplification path that comprises:
 a transistor die with a transistor and a transistor input terminal;
 an input-side impedance matching circuit coupled between the transistor input terminal and an input of the first amplification path, wherein the input-side impedance matching circuit includes
  an input-side harmonic termination circuit comprising a first inductive element and a first capacitance connected in series between the transistor input terminal and a ground reference node, wherein the first inductive element includes a first plurality of bondwires, and the input-side harmonic termination circuit resonates at a harmonic frequency of a fundamental frequency of operation of the RF amplifier, and a second inductive element and a second capacitance connected in series between the transistor input terminal and the ground reference node, wherein the second inductive element includes a second plurality of bondwires, and a third inductive element connected between the input of the first amplification path and the second capacitance, wherein the third inductive element includes a third plurality of bondwires.

2. The RF amplifier of claim 1, wherein the transistor is a gallium nitride transistor.

3. The RF amplifier of claim 1, wherein the first and second capacitances are metal-insulator-metal capacitors.

4. The RF amplifier of claim 1, wherein in the input-side harmonic termination circuit, the first inductive element is directly connected to the first capacitance.

5. The RF amplifier of claim 1, wherein the input-side harmonic termination circuit resonates at a second harmonic frequency of the fundamental frequency of operation.

6. The RF amplifier of claim 1, wherein:
the first capacitance value is in a range of 1 picofarad to 100 picofarads;
the second capacitance has a second capacitance value in a range of 5 picofarads to 120 picofarads;
the first inductive element has an inductance value in a range of 20 picohenries to 1 nanohenry; and
a series combination of the second and third inductive elements has an inductance value in a range of 50 picohenries to 3 nanohenries.

7. The RF amplifier of claim 1, wherein the transistor further includes a transistor output terminal, and the transistor has a drain-source capacitance below 0.2 picofarads per watt.

8. The RF amplifier of claim 1, further comprising:
a second amplification path;
a power divider with an input configured to receive an RF signal, a first output coupled to an input of the first amplification path, and a second output coupled to an input of the second amplification path, wherein the power divider is configured to divide the RF signal into a first RF signal that is provided to the first amplification path through the first output, and into a second RF signal that is provided to the second amplification path through the second output; and
a combining node configured to receive and combine amplified RF signals produced by the first and second amplification paths.

9. The RF amplifier of claim 8, wherein the RF amplifier is a Doherty power amplifier.

10. A radio frequency (RF) amplifier with a first amplification path that comprises:
a transistor die with a transistor and a transistor input terminal;
an input-side impedance matching circuit coupled between the transistor input terminal and an input of the first amplification path, wherein the input-side impedance matching circuit includes an input-side harmonic termination circuit comprising a first inductive element and a first capacitance connected in series between the transistor input terminal and a ground reference node, wherein the first inductive element includes a first plurality of bondwires, and the input-side harmonic termination circuit resonates at a harmonic frequency of a fundamental frequency of operation of the RF amplifier, and a second inductive element and a second capacitance connected in series between the transistor input terminal and the ground reference node, wherein the second inductive element includes a second plurality of bondwires, and a third inductive element connected between the input of the first amplification path and the second capacitance, wherein the third inductive element includes a third plurality of bondwires; and a video bandwidth circuit coupled to a connection node between the second inductive element and the second capacitance, wherein the video bandwidth circuit includes a plurality of components, wherein the plurality of components includes an envelope resistor, an envelope inductor, and an envelope capacitor coupled in series between the connection node and the ground reference node.

11. The RF amplifier of claim 10, wherein the video bandwidth circuit further includes a bypass capacitor coupled in parallel across one or more of the plurality of components of the video bandwidth circuit.

12. The RF amplifier of claim 11, wherein the bypass capacitor is coupled in parallel across the envelope inductor, and wherein the envelope inductor and the bypass capacitor form a parallel resonant circuit in proximity to a center operating frequency of the RF amplifier.

13. A radio frequency (RF) amplifier with a first amplification path that comprises:
a transistor die with a transistor, a transistor input terminal, and a transistor output terminal, wherein the transistor has a drain-source capacitance below 0.2 picofarads per watt;
an input-side impedance matching circuit coupled between the transistor input terminal and an input of the first amplification path, wherein the input-side impedance matching circuit includes
an input-side harmonic termination circuit comprising a first inductive element and a first capacitance connected in series between the transistor input terminal and a ground reference node, wherein the first inductive element includes a first plurality of bondwires, and the input-side harmonic termination circuit resonates at a harmonic frequency of a fundamental frequency of operation of the RF amplifier,
a second inductive element and a second capacitance connected in series between the transistor input terminal and the ground reference node, wherein the second inductive element includes a second plurality of bondwires, and
a third inductive element connected between the input of the first amplification path and the second capacitance, wherein the third inductive element includes a third plurality of bondwires; and
an output-side impedance matching circuit coupled between the transistor output terminal and an output of the first amplification path, wherein the output-side impedance matching circuit includes
an output-side harmonic termination circuit comprising a fourth inductive element and a third capacitance connected in series between the transistor output terminal and the ground reference node, wherein an equivalent capacitance from a combination of the fourth inductive element and the third capacitance in series effectively increases the drain-source capacitance by at least 10 percent, the fourth inductive element includes a fourth plurality of bondwires, and the output-side harmonic termination circuit resonates at a harmonic frequency of the fundamental frequency of operation of the RF amplifier, and
a fifth inductive element and a fourth capacitance connected in series between the transistor output terminal and the ground reference node, wherein the fifth inductive element includes a fifth plurality of bondwires, and wherein the fifth plurality of bondwires and the fourth capacitance are directly connected.

14. A packaged radio frequency (RF) amplifier device comprising:
a device substrate;
a first input lead coupled to the device substrate;
a first output lead coupled to the device substrate;
a first transistor die coupled to the device substrate, wherein the first transistor die includes a first transistor, a transistor input terminal coupled to the first input lead, and a transistor output terminal coupled to the first output lead, and wherein the first transistor has a drain-source capacitance below 0.2 picofarads per watt;
a first integrated passive device coupled to the device substrate; and
an input-side impedance matching circuit coupled between the transistor input terminal and the first input lead, wherein the input-side impedance matching circuit includes
an input-side harmonic termination circuit comprising a first inductive element and a first capacitance connected in series between the transistor input terminal and a ground reference node, wherein the first inductive element includes a first plurality of bondwires connected between the first transistor die and the first integrated passive device, and the input-side harmonic termination circuit resonates at a harmonic frequency of a fundamental frequency of operation of the RF amplifier device,
a second inductive element and a second capacitance connected in series between the transistor input terminal and the ground reference node, wherein the second inductive element includes a second plurality of bondwires, and
a third inductive element connected between the first input lead and the second capacitance, wherein the third inductive element includes a third plurality of bondwires.

15. The packaged RF amplifier device of claim 14, wherein the second capacitance is integrally formed with the first integrated passive device.

16. The packaged RF amplifier device of claim 15, wherein the first and second capacitances are metal-insulator-metal capacitors.

17. The packaged RF amplifier device of claim 14, wherein the transistor is a gallium nitride transistor.

18. The packaged RF amplifier device of claim 14, wherein the input-side harmonic termination circuit resonates at a second harmonic frequency of the fundamental frequency of operation.

19. The packaged RF amplifier device of claim 14, wherein:
the first capacitance value is in a range of 1 picofarad to 100 picofarads;
the second capacitance has a second capacitance value in a range of 5 picofarads to 120 picofarads;
the first inductive element has an inductance value in a range of 20 picohenries to 1 nanohenry; and
a series combination of the second and third inductive elements has an inductance value in a range of 50 picohenries to 3 nanohenries.

20. The packaged RF amplifier device of claim 14, further comprising:
a video bandwidth circuit coupled to a connection node between the second inductive element and the second capacitance, wherein the video bandwidth circuit includes a plurality of components, wherein the plurality of components includes an envelope resistor, an envelope inductor, and an envelope capacitor coupled in series between the connection node and the ground reference node.

21. The packaged RF amplifier device of claim 20, wherein the video bandwidth circuit further includes a bypass capacitor coupled in parallel across one or more of the plurality of components of the video bandwidth circuit.

22. The packaged RF amplifier device of claim 14, further comprising:
a second integrated passive device coupled to the device substrate; and
an output-side impedance matching circuit coupled between the transistor output terminal and the first output lead, wherein the output-side impedance matching circuit includes
an output-side harmonic termination circuit comprising a fourth inductive element and a third capacitance connected in series between the transistor output terminal and the ground reference node, wherein an equivalent capacitance from a combination of the fourth inductive element and the third capacitance in series effectively increases the drain-source capacitance by at least 10 percent, the fourth inductive element includes a fourth plurality of bondwires connected between the first transistor die and the second integrated passive device, and the output-side harmonic termination circuit resonates at a harmonic frequency of the fundamental frequency of operation of the RF amplifier device, and
a fifth inductive element and a fourth capacitance connected in series between the transistor output terminal and the ground reference node, wherein the fifth inductive element includes a fifth plurality of bondwires, and wherein the fifth plurality of bondwires and the fourth capacitance are directly connected.

23. The packaged RF amplifier device of claim 14, further comprising:
a second input lead coupled to the device substrate;
a second output lead coupled to the device substrate;
a second transistor die coupled to the device substrate, wherein the second transistor die includes a second transistor coupled between the second input lead and the second output lead; and
a second integrated passive device coupled to the device substrate between the second transistor die and the second input.

24. A method of manufacturing an RF amplifier device, the method comprising the steps of:
coupling an input lead to a device substrate;
coupling an output lead to the device substrate;
coupling a transistor die to the device substrate between the input and output leads, wherein the transistor die includes a transistor and a transistor output terminal, and wherein the transistor has a drain-source capacitance below 0.2 picofarads per watt;

coupling a first integrated passive device to the device substrate between the transistor die and the input lead, wherein the first integrated passive device includes a first capacitance and a second capacitance, wherein the first capacitance includes a first capacitor that is integrally formed with the first integrated passive device, and the second capacitance also is integrally formed with the first integrated passive device;

creating an input-side harmonic termination circuit by connecting a first inductive element in the form of a first plurality of bondwires between the transistor input terminal and the first capacitance, wherein the input-side harmonic termination circuit resonates at a harmonic frequency of a fundamental frequency of operation of the RF amplifier device; and creating a portion of an input-side impedance matching circuit by connecting a second inductive element in the form of a second plurality of bondwires between the transistor input terminal and the second capacitance, and connecting a third inductive element in the form of a third plurality of bondwires between the input lead and the second capacitance.

25. The method of claim 24, further comprising:

coupling a second integrated passive device to the device substrate between the transistor die and the output lead, wherein the second integrated passive device includes a third capacitance and a fourth capacitance, wherein the third capacitance includes one or more third capacitors that are integrally formed with the second integrated passive device, and the fourth capacitance also is integrally formed with the second integrated passive device;

creating an output-side harmonic termination circuit by connecting a fourth inductive element in the form of a fourth plurality of bondwires between the transistor output terminal and the third capacitance, wherein an equivalent capacitance from a combination of the fourth inductive element and the third capacitance in series effectively increases the drain-source capacitance by at least 10 percent, and the output-side harmonic termination circuit resonates at a harmonic frequency of the fundamental frequency of operation of the RF amplifier device; and creating a portion of an output-side impedance matching circuit by connecting a fifth inductive element in the form of a fifth plurality of bondwires between the transistor output terminal and the fourth capacitance, wherein the fifth plurality of bondwires and the fourth capacitance are directly connected.

* * * * *